US011205589B2

(12) United States Patent
Ren et al.

(10) Patent No.: US 11,205,589 B2
(45) Date of Patent: Dec. 21, 2021

(54) METHODS AND APPARATUSES FOR FORMING INTERCONNECTION STRUCTURES

(71) Applicant: APPLIED MATERIALS, INC., Santa Clara, CA (US)

(72) Inventors: He Ren, San Jose, CA (US); Hao Jiang, San Jose, CA (US); Mehul Naik, San Jose, CA (US); Srinivas D Nemani, Sunnyvale, CA (US); Ellie Yieh, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/594,057

(22) Filed: Oct. 6, 2019

(65) Prior Publication Data
US 2021/0104434 A1    Apr. 8, 2021

(51) Int. Cl.
| | | |
|---|---|---|
| H01L 21/76 | (2006.01) | |
| H01L 21/28 | (2006.01) | |
| H01L 21/768 | (2006.01) | |
| H01L 21/285 | (2006.01) | |
| H01L 21/67 | (2006.01) | |
| C23C 14/58 | (2006.01) | |

(Continued)

(52) U.S. Cl.
CPC ........ *H01L 21/76864* (2013.01); *C23C 14/16* (2013.01); *C23C 14/5806* (2013.01); *C23C 14/5873* (2013.01); *H01L 21/28568* (2013.01); *H01L 21/32136* (2013.01); *H01L 21/67069* (2013.01); *H01L 21/67109* (2013.01); *H01L 21/67167* (2013.01); *H01L 21/67196* (2013.01); *H01L 21/67207* (2013.01); *H01L 21/7685* (2013.01); *H01L 21/76862* (2013.01); *H01L 21/76892* (2013.01)

(58) Field of Classification Search
CPC ........ H01L 21/76864; H01L 21/67167; H01L 21/67069; H01L 21/67109; H01L 21/7685; H01L 21/67196; H01L 21/76892; H01L 21/76862; H01L 21/67207; H01L 21/32136; H01L 21/28568; C23C 14/5806; C23C 14/16; C23C 14/5873
USPC .......................... 438/656, 773, 125, 589, 655
See application file for complete search history.

(56) References Cited

U.S. PATENT DOCUMENTS

| 6,143,658 A * | 11/2000 | Donnelly, Jr ..... H01L 21/02065 257/E21.311 |
| 6,297,154 B1 * | 10/2001 | Gross .................. H01L 21/2885 257/E21.175 |

(Continued)

OTHER PUBLICATIONS

International Search Report for PCT/US2020/054242, dated Jan. 27, 2021.

*Primary Examiner* — Sheikh Maruf
(74) *Attorney, Agent, or Firm* — Moser Taboada

(57) ABSTRACT

Methods and apparatus for lowering resistivity of a metal line, including: depositing a first metal layer atop a second metal layer to under conditions sufficient to increase a grain size of a metal of the first metal layer; etching the first metal layer to form a metal line with a first line edge roughness and to expose a portion of the second metal layer; removing impurities from the metal line by a hydrogen treatment process; and annealing the metal line at a pressure between 760 Torr and 76,000 Torr to reduce the first line edge roughness.

20 Claims, 8 Drawing Sheets

(51) Int. Cl.
*H01L 21/3213* (2006.01)
*C23C 14/16* (2006.01)

(56) References Cited

U.S. PATENT DOCUMENTS

| | | | |
|---|---|---|---|
| 6,723,186 B2 * | 4/2004 | Lee | C23C 14/5806 |
| | | | 148/516 |
| 6,838,379 B1 | 1/2005 | Kwak et al. | |
| 7,030,016 B2 | 4/2006 | Feng et al. | |
| 7,956,463 B2 | 6/2011 | Yang et al. | |
| 9,508,561 B2 | 11/2016 | Naik et al. | |
| 9,748,173 B1 * | 8/2017 | Murray | H01L 21/76831 |
| 10,388,533 B2 | 8/2019 | Ren et al. | |
| 10,435,849 B2 * | 10/2019 | Tusino | E01B 3/30 |
| 10,438,849 B2 | 10/2019 | Ren et al. | |
| 2003/0079686 A1 * | 5/2003 | Chen | C23C 16/4411 |
| | | | 118/715 |
| 2003/0092261 A1 * | 5/2003 | Kondo | H01L 21/67396 |
| | | | 438/638 |
| 2003/0143841 A1 * | 7/2003 | Yang | H01L 21/28556 |
| | | | 438/656 |
| 2003/0161952 A1 * | 8/2003 | Wang | C23C 16/02 |
| | | | 427/255.392 |
| 2003/0172872 A1 * | 9/2003 | Thakur | C23C 16/45536 |
| | | | 118/715 |
| 2003/0235977 A1 * | 12/2003 | Usami | H01L 21/76855 |
| | | | 438/622 |
| 2004/0092101 A1 * | 5/2004 | Pyo | H01L 21/76843 |
| | | | 438/687 |
| 2004/0229415 A1 * | 11/2004 | Takehashi | H01L 29/78621 |
| | | | 438/163 |
| 2005/0009325 A1 * | 1/2005 | Chung | C23C 16/02 |
| | | | 438/637 |
| 2005/0070090 A1 * | 3/2005 | Lee | H01L 21/76879 |
| | | | 438/629 |
| 2005/0208774 A1 * | 9/2005 | Fukunaga | C23G 1/103 |
| | | | 438/745 |
| 2005/0227479 A1 * | 10/2005 | Feng | H01L 21/2885 |
| | | | 438/637 |
| 2007/0009658 A1 * | 1/2007 | Yoo | H01L 21/28562 |
| | | | 427/248.1 |
| 2007/0020890 A1 * | 1/2007 | Thakur | H01L 21/67184 |
| | | | 438/478 |
| 2007/0119370 A1 * | 5/2007 | Ma | H01L 21/76873 |
| | | | 118/723 E |
| 2007/0283886 A1 * | 12/2007 | Chung | H01L 21/76871 |
| | | | 118/719 |
| 2010/0267230 A1 * | 10/2010 | Chandrashekar | C23C 16/045 |
| | | | 438/648 |
| 2011/0062587 A1 * | 3/2011 | Yang | H01L 21/76846 |
| | | | 257/751 |
| 2011/0249783 A1 * | 10/2011 | Piantelli | G21B 3/002 |
| | | | 376/146 |
| 2013/0298942 A1 * | 11/2013 | Ren | H01L 21/76814 |
| | | | 134/1.2 |
| 2014/0011358 A1 * | 1/2014 | Chen | H01L 23/485 |
| | | | 438/680 |
| 2014/0027664 A1 * | 1/2014 | Lei | H01L 21/76843 |
| | | | 252/62.3 R |
| 2014/0030889 A1 * | 1/2014 | Chen | H01L 21/28556 |
| | | | 438/675 |
| 2014/0061931 A1 * | 3/2014 | Kang | H01L 21/76843 |
| | | | 257/770 |
| 2014/0073135 A1 * | 3/2014 | Guan | H01L 21/76861 |
| | | | 438/680 |
| 2014/0099734 A1 * | 4/2014 | Saito | C23C 16/56 |
| | | | 438/3 |
| 2014/0287577 A1 | 9/2014 | Emesh et al. | |
| 2015/0037972 A1 * | 2/2015 | Danek | H01L 21/76841 |
| | | | 438/643 |
| 2015/0179461 A1 * | 6/2015 | Bamnolker | C23C 16/0209 |
| | | | 438/656 |
| 2015/0214101 A1 * | 7/2015 | Ren | H01L 21/31138 |
| | | | 438/704 |
| 2015/0262869 A1 * | 9/2015 | Naik | H01L 21/02274 |
| | | | 438/643 |
| 2016/0042958 A1 * | 2/2016 | Nishide | C23C 16/46 |
| | | | 438/652 |
| 2017/0263773 A1 * | 9/2017 | Yamazaki | H01L 29/7869 |
| 2017/0329785 A1 * | 11/2017 | He | G06F 7/08 |
| 2018/0012841 A1 * | 1/2018 | Murray | H01L 21/76826 |
| 2018/0158730 A1 * | 6/2018 | Jeon | H01L 21/76846 |
| 2018/0211872 A1 * | 7/2018 | Wu | H01L 21/28568 |
| 2019/0157200 A1 * | 5/2019 | Kittl | H01L 23/53209 |
| 2019/0311908 A1 | 10/2019 | Ren et al. | |
| 2019/0371610 A1 * | 12/2019 | Ren | C23C 14/3464 |

\* cited by examiner

METHODS AND APPARATUSES FOR FORMING INTERCONNECTION STRUCTURES

FIELD

Embodiments of the present disclosure generally relate to apparatuses and methods of forming integrated circuits (ICs). More particularly, the present disclosure relates to methods of forming metal containing interconnect structures using a subtractive etch processes.

BACKGROUND

Conventional damascene processing is not always compatible with the trend toward smaller feature sizes in modern complementary metal oxide semiconductor (CMOS) technology. For instance, modern CMOS technology may require line widths of less than twenty nanometers and aspect ratios (i.e., line height to line width) of approximately 4:1 or higher. Attempting conventional damascene processing within these parameters often results in poor liner/seed coverage on the walls of the openings formed into the interconnect dielectric material, and reentrant profiles. Consequently, the metal filling of the opening is subject to voids, defects, and poor adhesion to the liner material. Moreover, as the lines narrow in size, the resistivity of the metal is increased (due to, for example, the thickness of the liner relative to the metal, the small metal grain size, and metal grain boundary and surface scattering phenomena), resulting in decreased IC performance.

Subtractive metal etching has been employed to overcome deficiencies in conventional damascene processing and structures. For example, use of subtractive metal schemes lowers resistivity by avoiding the use of barriers and/or liners adjacent to metal lines while increasing conductor volume. However, the inventors have observed that as metal lines narrow in size formed from subtractive etching of blanket metal layers, the resistivity of the metal line is increased by line edge roughness, grain size, impurities, and surface scattering phenomena resulting in decreased IC performance. For example, the inventors have observed that metal layers including metal having a large grain size problematically have a high line edge roughness when etched resulting in increased resistance due to surface scattering phenomena, and that metal layers including metal having a smaller grain size have problematically high resistance when etched. Moreover, impurities such as process residuals or reaction byproducts present in the methods problematically increase resistivity and line edge roughness.

Therefore, the inventors have provided improved methods of forming interconnects using subtractive metal processes, improved metals, and integrated apparatuses for forming interconnects in accordance with the present disclosure.

SUMMARY

Methods and apparatuses for lowering resistivity of a metal line are provided herein. In some embodiments, an apparatus for lowering resistivity of a metal line includes: depositing a first metal layer atop a second metal layer under conditions sufficient to increase a grain size of a metal of the first metal layer; etching the first metal layer to form a metal line with a first line edge roughness and to expose a portion of the second metal layer; removing impurities from the metal line by a hydrogen treatment process; and annealing the metal line at a pressure between 760 Torr and 76,000 Torr to reduce the first line edge roughness.

Methods and apparatus for patterning a conductor layer on a substrate are provided herein. In some embodiments, a method for patterning a conductor layer on a substrate, includes: depositing a first metal layer atop a second metal layer; removing impurities from the first metal layer by a first hydrogen treatment process; annealing the first metal layer at a pressure of 760 Torr and 76,000 Torr; etching the first metal layer to form a metal line with a first line edge roughness atop the second metal layer and expose a top surface of the second metal layer; removing impurities from the metal line by a second hydrogen treatment process; and annealing the metal line under conditions sufficient to reduce the first line edge roughness.

In some embodiments, a substrate processing system, includes: a physical vapor depositing chamber configured for depositing a first metal layer on a substrate and for increasing a grain size of a metal of the first metal layer; and a thermal processing chamber configured for treating and annealing the first metal layer to remove impurities and increase the grain size of the metal.

A non-transitory computer readable medium having instructions stored thereon that, when executed, cause a method of lowering resistivity of a metal line, including: depositing a first metal layer atop a second metal layer under conditions sufficient to increase a grain size of a metal of the first metal layer; etching the first metal layer to form a metal line with a first line edge roughness and to expose a portion of the second metal layer; removing impurities from the metal line by a hydrogen treatment process; and annealing the metal line at a pressure between 760 Torr and 76,000 Torr to reduce the first line edge roughness.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
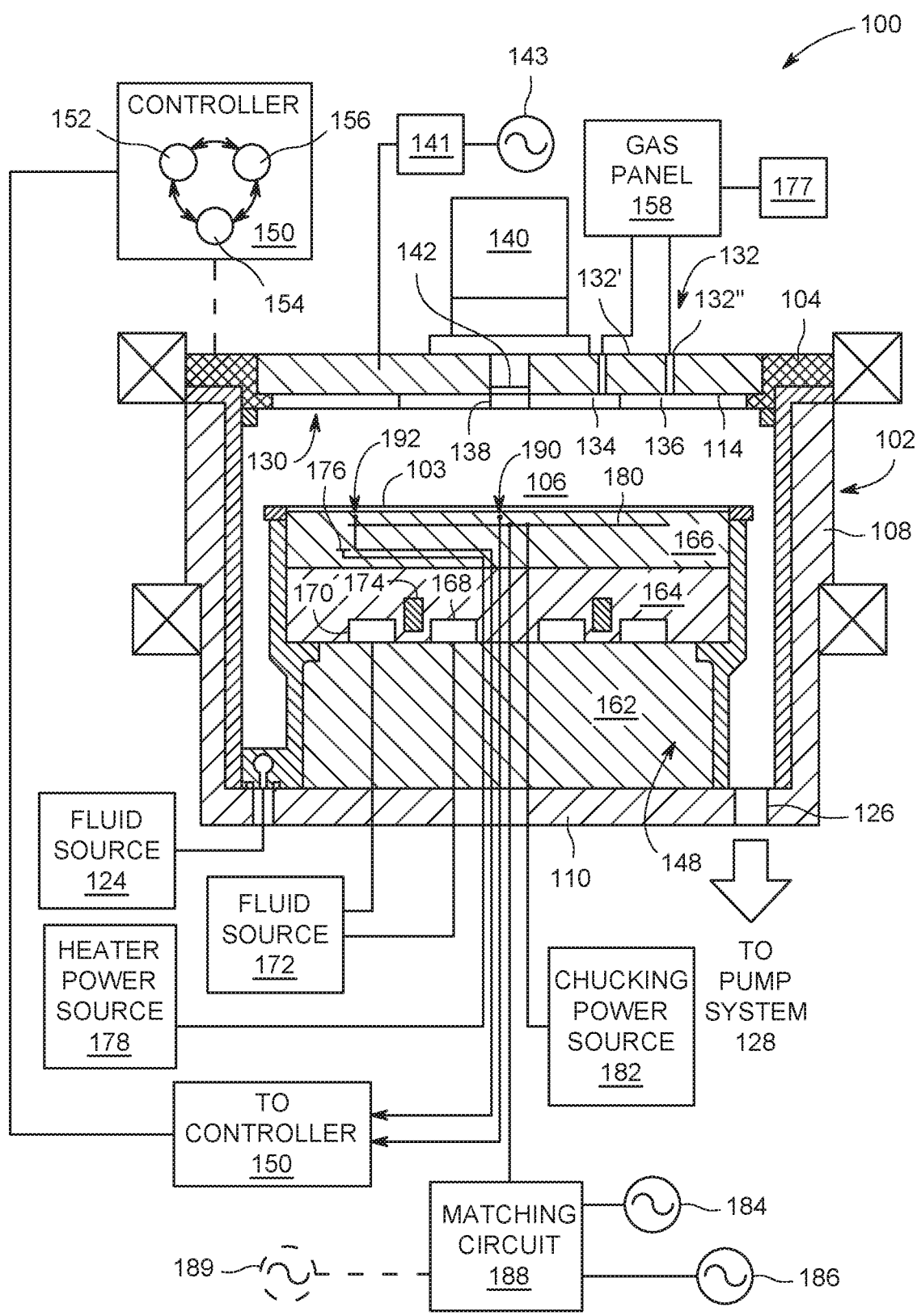
FIG. 1 is a schematic cross-sectional view of one embodiment of a process chamber suitable for etching in accordance with the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure provide methods that utilize a subtractive metal etch to form one or more improved metal lines having improved resistivity by reducing or eliminating line edge roughness causing increased resistance and decreased IC performance. In embodiments, the present disclosure relates to a method of lowering resistivity of a metal line, including: depositing a first metal layer atop a second metal layer under conditions sufficient to increase a grain size of a metal of the first metal layer; etching the first metal layer to form a metal line with a first line edge roughness and to expose a portion of the second metal layer; removing impurities from the metal line by a hydrogen treatment process; and annealing the metal line at a pressure between 760 Torr and 76,000 Torr to reduce the first line edge roughness. The inventors have found that subtractive etching in accordance with the present disclosure advantageously lowers resistance, allows for materials flexibility, and maximizes conductor volume. The inventors have found that post-deposition treatment and anneal and/or post-etch treatment and anneal in accordance with the present disclosure provides metal lines with low resistivity and low line edge roughness.

FIG. 1 is a sectional view of one example of a processing chamber 100 suitable for performing an etch process in accordance with the present disclosure. Suitable processing chambers that may be adapted for use with the teachings disclosed herein include, for example, a SYM3® processing chamber available from Applied Materials, Inc. of Santa Clara, Calif. Other processing chambers may be adapted to benefit from one or more of the methods of the present disclosure.

The processing chamber 100 includes a chamber body 102 and a lid 104 which enclose an interior volume 106. The chamber body 102 is typically fabricated from aluminum, stainless steel or other suitable material. The chamber body 102 generally includes sidewalls 108 and a bottom 110. A substrate support pedestal access port (not shown) is generally defined in a sidewall 108 and a selectively sealed by a slit valve to facilitate entry and egress of a substrate 103 from the processing chamber 100. An exhaust port 126 is defined in the chamber body 102 and couples the interior volume 106 to a pump system 128. The pump system 128 generally includes one or more pumps and throttle valves utilized to evacuate and regulate the pressure of the interior volume 106 of the processing chamber 100. In embodiments, the pump system 128 maintains the pressure inside the interior volume 106 at operating pressures typically between about 1 mTorr to about 500 mTorr, between about 5 mTorr to about 100 mTorr, or between about 5 mTorr to 50 mTorr depending upon process needs.

In embodiments, the lid 104 is sealingly supported on the sidewall 108 of the chamber body 102. The lid 104 may be opened to allow excess to the interior volume 106 of the processing chamber 100. The lid 104 includes a window 142 that facilitates optical process monitoring. In one embodiment, the window 142 is comprised of quartz or other suitable material that is transmissive to a signal utilized by an optical monitoring system 140 mounted outside the processing chamber 100.

The optical monitoring system 140 is positioned to view at least one of the interior volume 106 of the chamber body 102 and/or the substrate 103 positioned on a substrate support pedestal assembly 148 through the window 142. In one embodiment, the optical monitoring system 140 is coupled to the lid 104 and facilitates an integrated deposition process that uses optical metrology to provide information that enables process adjustment to compensate for incoming substrate pattern feature inconsistencies (such as thickness, and the like), provide process state monitoring (such as plasma monitoring, temperature monitoring, and the like) as needed. One optical monitoring system that may be adapted to benefit from the present disclosure is the EYED® full-spectrum, interferometric metrology module, available from Applied Materials, Inc., of Santa Clara, Calif.

In embodiments, a gas panel 158 is coupled to the processing chamber 100 to provide process and/or cleaning gases to the interior volume 106. In the example depicted in FIG. 1, inlet ports 132', 132" are provided in the lid 104 to allow gases to be delivered from the gas panel 158 to the interior volume 106 of the processing chamber 100. In embodiments, the gas panel 158 is adapted to provide oxygen and inert gas such as argon, or oxygen and helium process gas or gas mixture through the inlet ports 132', 132" and into the interior volume 106 of the processing chamber 100. In one embodiment, the process gas provided from the gas panel 158 includes at least a process gas including an oxidizing agent such as oxygen gas. In embodiments, the process gas including an oxidizing agent may further comprise an inert gas such as argon or helium. In some embodiments, the process gas includes a reducing agent such as hydrogen and may be mixed with an inert gas such as argon, or other gases such as nitrogen or helium. In some embodiments, a chlorine gas may be provided alone, or in combination with at least one of nitrogen, helium an inert gas such as argon. Non-limiting examples of oxygen containing gas includes one or more of $O_2$, $CO_2$, $N_2O$, $NO_2$, $O_3$, $H_2O$, and the like. Non-limiting examples of nitrogen containing gas includes $N_2$, $NH_3$, and the like. Non-limiting examples of chlorine containing gas includes HCl, $Cl_2$, $CCl_4$, and the like. In embodiments, a showerhead assembly 130 is coupled to an interior surface 114 of the lid 104. The showerhead assembly 130 includes a plurality of apertures that allow the gases flowing through the showerhead assembly 130 from the inlet ports 132', 132" into the interior volume 106 of the processing chamber 100 in a predefined distribution across the surface of the substrate 103 being processed in the processing chamber 100.

In some embodiments, the processing chamber 100 may utilize capacitively coupled RF energy for plasma processing, or in some embodiments, processing chamber 100 may use inductively coupled RF energy for plasma processing. In some embodiments, a remote plasma source 177 may be optionally coupled to the gas panel 158 to facilitate dissociating gas mixture from a remote plasma prior to entering the interior volume 106 for processing. In some embodiments, a RF source power 143 is coupled through a matching network 141 to the showerhead assembly 130. The RF source power 143 typically can produce up to about 5000 W for example between about 200 W to about 5000 W, or between 1000 W to 3000 W, or about 1500 W and optionally at a tunable frequency in a range from about 50 kHz to about 200 MHz.

The showerhead assembly 130 additionally includes a region transmissive to an optical metrology signal. The optically transmissive region or passage 138 is suitable for allowing the optical monitoring system 140 to view the interior volume 106 and/or the substrate 103 positioned on the substrate support pedestal assembly 148. The passage 138 may be a material, an aperture or plurality of apertures formed or disposed in the showerhead assembly 130 that is substantially transmissive to the wavelengths of energy generated by, and reflected to, the optical monitoring system 140. In one embodiment, the passage 138 includes a window 142 to prevent gas leakage through the passage 138. The window 142 may be a sapphire plate, quartz plate or other suitable material. The window 142 may alternatively be disposed in the lid 104.

In one embodiment, the showerhead assembly 130 is configured with a plurality of zones that allow for separate control of gas flowing into the interior volume 106 of the processing chamber 100. In the example illustrated in FIG. 1, the showerhead assembly 130 as an inner zone 134 and an outer zone 136 that are separately coupled to the gas panel 158 through separate inlet ports 132', 132".

In some embodiments, the substrate support pedestal assembly 148 is disposed in the interior volume 106 of the processing chamber 100 below the gas distribution assembly such as showerhead assembly 130. The substrate support pedestal assembly 148 holds the substrate 103 during processing. The substrate support pedestal assembly 148 generally includes a plurality of lift pins (not shown) disposed therethrough that are configured to lift the substrate 103 from the substrate support pedestal assembly 148 and facilitate exchange of the substrate 103 with a robot (not shown) in a conventional manner. An inner liner 118 may closely circumscribe the periphery of the substrate support pedestal assembly 148.

In one embodiment, the substrate support pedestal assembly 148 includes a mounting plate 162, a base 164 and an electrostatic chuck 166. The mounting plate 162 is coupled to the bottom 110 of the chamber body 102 includes passages for routing utilities, such as fluids, power lines and sensor leads, among others, to the base 164 and the electrostatic chuck 166. The electrostatic chuck 166 comprises at least one clamping electrode 180 for retaining the substrate 103 below showerhead assembly 130. The electrostatic chuck 166 is driven by a chucking power source 182 to develop an electrostatic force that holds the substrate 103 to the chuck surface, as is conventionally known. Alternatively, the substrate 103 may be retained to the substrate support pedestal assembly 148 by clamping, vacuum or gravity.

At least one base 164 or electrostatic chuck 166 may include at least one optional embedded heater 176, at least one optional embedded isolator 174 and a plurality of conduits 168, 170 to control the lateral temperature profile of the substrate support pedestal assembly 148. The conduits 168, 170 are fluidly coupled to a fluid source 172 that circulates a temperature regulating fluid therethrough. The heater 176 is regulated by a power source 178. The conduits 168, 170 and heater 176 are utilized to control the temperature of the base 164, heating and/or cooling the electrostatic chuck 166 and ultimately, the temperature profile of the substrate 103 disposed thereon. The temperature of the electrostatic chuck 166 and the base 164 may be monitored using a plurality of temperature sensors 190, 192. The electrostatic chuck 166 may further include a plurality of gas passages (not shown), such as grooves, that are formed in a substrate support pedestal supporting surface of the electrostatic chuck 166 and fluidly coupled to a source of a heat transfer (or backside) gas, such as helium (He). In operation, the backside gas is provided at controlled pressure into the gas passages to enhance the heat transfer between the electrostatic chuck 166 and the substrate 103. In embodiments, the temperature of the substrate may be maintained at 20 degrees Celsius to 450 degrees Celsius, such as 100 degrees Celsius to 300 degrees Celsius, or 150 degrees Celsius to 250 degrees Celsius.

In one embodiment, the substrate support pedestal assembly 148 is configured as a cathode and includes an electrode 180 that is coupled to a plurality of RF power bias power sources 184, 186. The RF bias power sources 184, 186 are coupled between the electrode 180 disposed in the substrate support pedestal assembly 148 and another electrode, such as the showerhead assembly 130 or ceiling (lid 104) of the chamber body 102. The RF bias power excites and sustains a plasma discharge formed from the gases disposed in the processing region of the chamber body 102.

Still referring to FIG. 1, in some embodiments the dual RF bias power sources 184, 186 are coupled to the electrode 180 disposed in the substrate support pedestal assembly 148 through a matching circuit 188. The signal generated by the RF bias power sources 184, 186 is delivered through matching circuit 188 to the substrate support pedestal assembly 148 through a single feed to ionize the gas mixture provided in the plasma processing chamber such as processing chamber 100, thus providing ion energy necessary for performing an etch deposition or other plasma enhanced process. The RF bias power source 184, 186 are generally capable of producing an RF signal having a frequency of from about 50 kHz to about 200 MHz and a power between about 0 Watts and about 500 Watts, 1 Watt (W) to about 100 W, or about 1 W to about 30 W. An additional bias power 189 may be coupled to the electrode 180 to control the characteristics of the plasma.

Figure 7A:
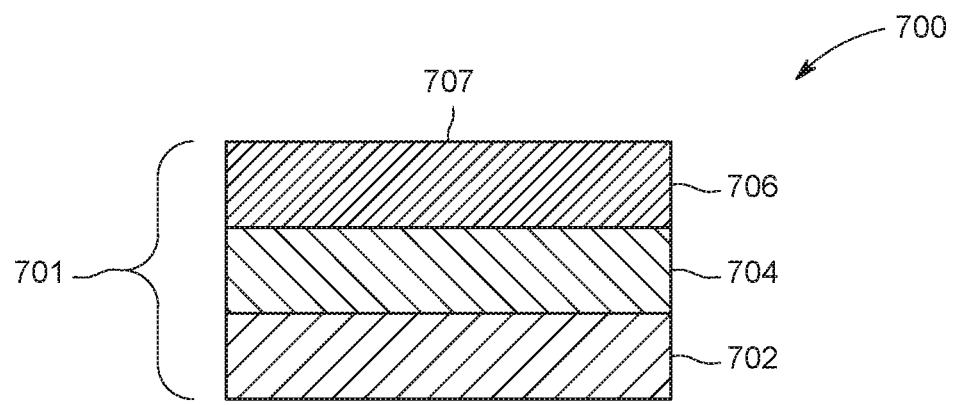
FIGS. 7A-7B depict one embodiment of a sequence for forming the interconnection structure in accordance with the present disclosure.

During operation, the substrate 103 (which may comprise a first metal layer to be etched disposed atop a second metal layer as shown in FIG. 7A) is disposed on the substrate support pedestal assembly 148 in the plasma processing chamber such as processing chamber 100. A process gas and/or gas mixture is introduced into the chamber body 102 through the showerhead assembly 130 from the gas panel 158. A vacuum pump system such as pump system 128 maintains the pressure inside the chamber body 102 while removing deposition by-products.

A controller 150 is coupled to the processing chamber 100 to control operation of the processing chamber 100. The controller 150 includes a central processing unit (CPU) 152, a memory 154, and a support circuit 156 utilized to control the process sequence and regulate the gas flows from the gas panel 158. The CPU 152 may be any form of general-purpose computer processor that may be used in an industrial setting. The software routines can be stored in the memory 154, such as random-access memory, read only memory, floppy, or hard disk drive, or other form of digital storage. The support circuit 156 is conventionally coupled to the CPU 152 and may include cache, clock circuits, input/output systems, power supplies, and the like. Bi-directional communications between the controller 150 and the various components of the processing chamber 100 are handled through numerous signal cables.

Figure 2:
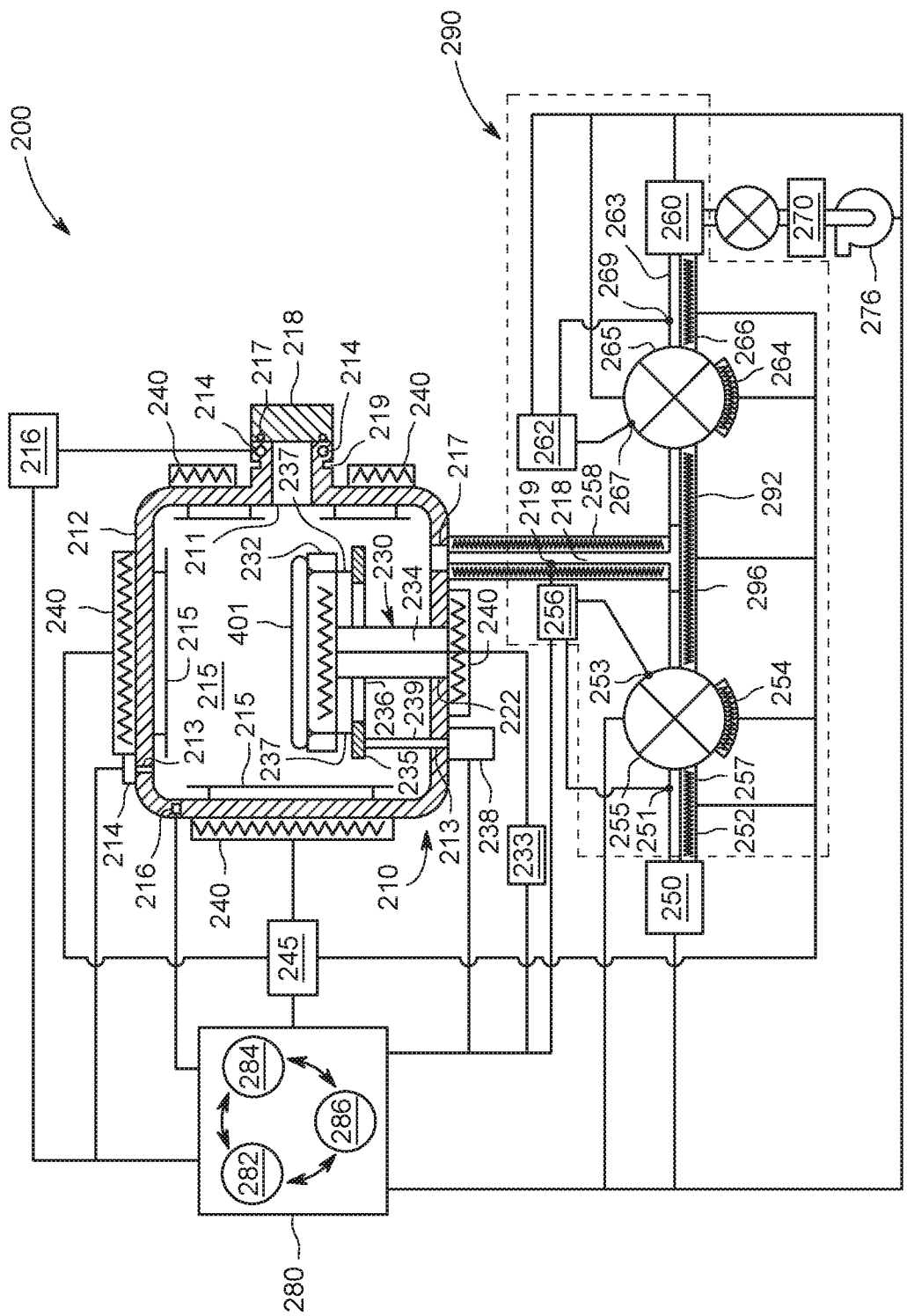
FIG. 2 is a schematic cross-sectional view of one embodiment of a process chamber suitable for annealing in accordance with the present disclosure.

Referring now to FIG. 2, a simplified front cross-sectional view of a single-substrate processing chamber 200 for annealing in accordance with the present disclosure is shown. In some embodiments, processing chamber 200 is configured for a high-pressure annealing process of a substrate in accordance with the present disclosure, such as a single substrate such as substrate 401 shown in FIG. 2. In some embodiments, a single-substrate processing chamber 200 has a body 210 with an outer surface 212 and an inner surface 213 that encloses an internal volume 215. In some embodiments such as in FIG. 2, the body 210 has an annular cross section, and in other embodiments, the cross-section of the body 210 may be rectangular or any closed shape. The outer surface 212 of the body 210 may be made from a corrosion resistant steel (CRS), such as but not limited to stainless steel. One or more heat shields 225 are disposed on the inner surface 213 of the body 210 that prevents heat loss from the single-substrate processing chamber 200 into the outside environment. The inner surface 213 of the body 210 as well as the heat shields 225 may be made from nickel-based steel alloys that exhibit high resistance to corrosion, such as but not limited to HASTELLOY®, ICONEL®, and MONEL® brand materials.

In some embodiments, a substrate support 230 is disposed within the internal volume 215. The substrate support 230 has a stem 234 and a substrate-supporting member 232 held by the stem 234. The stem 234 passes through a passage 222 formed through the body 210. A rod 239 connected to an actuator 238 passes through a second passage 223 formed through the body 210. The rod 239 is coupled to a plate 235 having an aperture 236 accommodating the stem 234 of the substrate support 230. Lift pins 237 are connected to the substrate-supporting member 232. The actuator 238 actuates the rod 239 such that the plate 235 is moved up or down to connect and disconnect with the lift pins 237. As the lift pins 237 are raised or lowered, the substrate-supporting member 232 is raised or lowered within the internal volume 215 of the chamber 200. In some embodiments, the substrate-supporting member 232 has a resistive heating element 231 embedded centrally within. A power source 233 is configured to electrically power the resistive heating element 231. The operation of the power source 233 as well as the actuator 238 is controlled by a controller 280.

In some embodiments, the single-substrate processing chamber 200 has an opening 211 on the body 210 through which one or more substrates 401 can be loaded and unloaded to and from the substrate support 230 disposed in the internal volume 215. The opening 211 forms a tunnel on the body 210. A slit valve 218 is configured to sealably close the tunnel such that the opening 211 and the internal volume 215 can only be accessed when the slit valve 218 is open. A high-pressure seal is utilized to seal the slit valve 218 to the body 210 in order to seal the internal volume 215 for processing. The high-pressure seal may be made from a polymer, for example a fluoropolymer, such as but not limited to a perfluoroelastomer and polytetrafluoroethylene (PTFE). The high-pressure seal may further include a spring member for biasing the seal to improve seal performance. A cooling channel is disposed on the tunnel adjacent to the high-pressure seals in order to maintain the high-pressure seals below the maximum safe-operating temperature of the high-pressure seals during processing. A cooling agent from a cooling fluid source, such as but not limited to an inert, dielectric, and high-performance heat transfer fluid, may be circulated within the cooling channel. The flow of the cooling agent from the cooling fluid source is controlled by the controller 280 through feedback received from a temperature sensor 216 or a flow sensor (not shown). An annular-shaped thermal choke is formed around the tunnel to prevent the flow of heat from the internal volume 215 through the opening 211 when the slit valve 218 is open.

The single-substrate processing chamber 200 has a port 217 through the body 210, which is fluidly connected to a fluid circuit 290 connecting the gas panel 250, the condenser 260 and the port 217. The fluid circuit 290 has a gas conduit 292, a source conduit 257, an inlet isolation valve 255, an exhaust conduit 263, and an outlet isolation valve 265. A number of heaters 296, 258, 252, 254, 264, 266 are interfaced with different portions of the fluid circuit 290. A number of temperature sensors 251, 253, 219, 267 and 269 are also placed at different portions of the fluid circuit 290 to take temperature measurements and send the information to the controller 280. The controller 280 uses the temperature measurement information to control the operation of the heaters 252, 254, 258, 296, 264, and 266 such that the temperature of the fluid circuit 290 is maintained at a temperature above the condensation point of the processing fluid disposed in the fluid circuit 290 and the internal volume 215.

In some embodiments, the gas panel 250 is configured to provide a processing fluid under pressure the internal volume 215. The pressure of the processing fluid introduced into the internal volume 215 is monitored by a pressure sensor 214 coupled to the body 210. The condenser 260 is fluidly coupled to a cooling fluid source (not shown) and configured to condense the gas phase processing fluid exiting the internal volume 215 through the gas conduit 292. The condensed processing fluid is then removed by the pump 276. One or more heaters 240 are disposed on the body 210 and configured to heat the internal volume 215 within the single-substrate processing chamber 200. The heaters 240, 252, 254, 258, 296, 264, and 266 maintain the processing fluid within the fluid circuit 290 in a gaseous phase while the outlet isolation valve 265 to the condenser 260 is open to prevent condensation within the fluid circuit.

The controller 280 controls the operation of the single-substrate processing chamber 200. The controller 280 controls the operation of the gas panel 250, the condenser 260, the pump 270, the inlet isolation valve 255, the outlet isolation valve 265, and the power sources 233 and 245. The controller 280 is also communicatively connected to the temperature sensor 216, the pressure sensor 214, the actuator 238, the cooling fluid source 226 and the temperature reading devices 256 and 262.

In some embodiments, the controller 280 includes a computing device and may be one of any form of general-purpose computer that can be used in an industrial setting for controlling various chambers and sub-processors. In some embodiments, the computing device includes a computer processor 282 and memory 284. The memory 284 may include any suitable memory, such as random-access memory, read only memory, flash memory, hard disk, or any other forms of digital storage, local or remote. The computing device may include various support circuits 286, which may be coupled to the computer processor 282 for supporting the computer processor 282 in a conventional manner. Software routines, as required, may be stored in the memory 284 or executed by a second computing device (not shown) that is remotely located. In some embodiments, the computing device may further include one or more computer readable media. Computer readable media generally includes any device, located either locally or remotely, which is capable of storing information that is retrievable by a computing device. Examples of computer readable media useable with embodiments of the present disclosure include solid state memory, floppy disks, internal or external hard drives, and optical memory (CDs, DVDs, BR-D, etc). In one embodiment, the memory 284 may be the computer readable media. Software routines may be stored on the computer readable media to be executed by the computing device. The software routines, when executed, transform the general-purpose computer into a specific process computer that controls the chamber operation so that a chamber process is performed.

In some embodiments, a processing fluid may include hydrogen-containing gas such as $H_2$, or nitrogen-containing gas such as $N_2$.

In some embodiments, the processing fluid may be reacted with the metal materials on the substrate to form metal oxynitrides, metal oxides, and the like. During processing of a substrate of the present disclosure such as substrate 401, an environment of the high-pressure region or internal volume 215 is maintained at a temperature and pressure that maintains the processing fluid within the high-pressure region in a vapor phase. In embodiments, pressure and temperature is pre-selected based on the composition of the processing fluid. For example, in some embodiments, processing fluid comprises argon, helium, or nitrogen, in combination with 4% hydrogen in nitrogen to 100% hydrogen. In one example, high-pressure region or internal volume 215 is pressurized to a pressure greater than atmosphere, for example 760 Torr to 76,000 Torr. In another example, high-pressure region or internal volume 215 is pressurized to a pressure from between about 7,600 and about 37,500 Torr, such as from between about 15,000 and about 36,000 Torr. In another example, the high-pressure region or internal volume 215 is pressurized to a pressure up to about 76,000 Torr. In some embodiments, during processing, the high-pressure region or internal volume 215 is also maintained at a high temperature, for example, a temperature between about 300 degrees Celsius and about 600 degrees Celsius.

Figure 3:
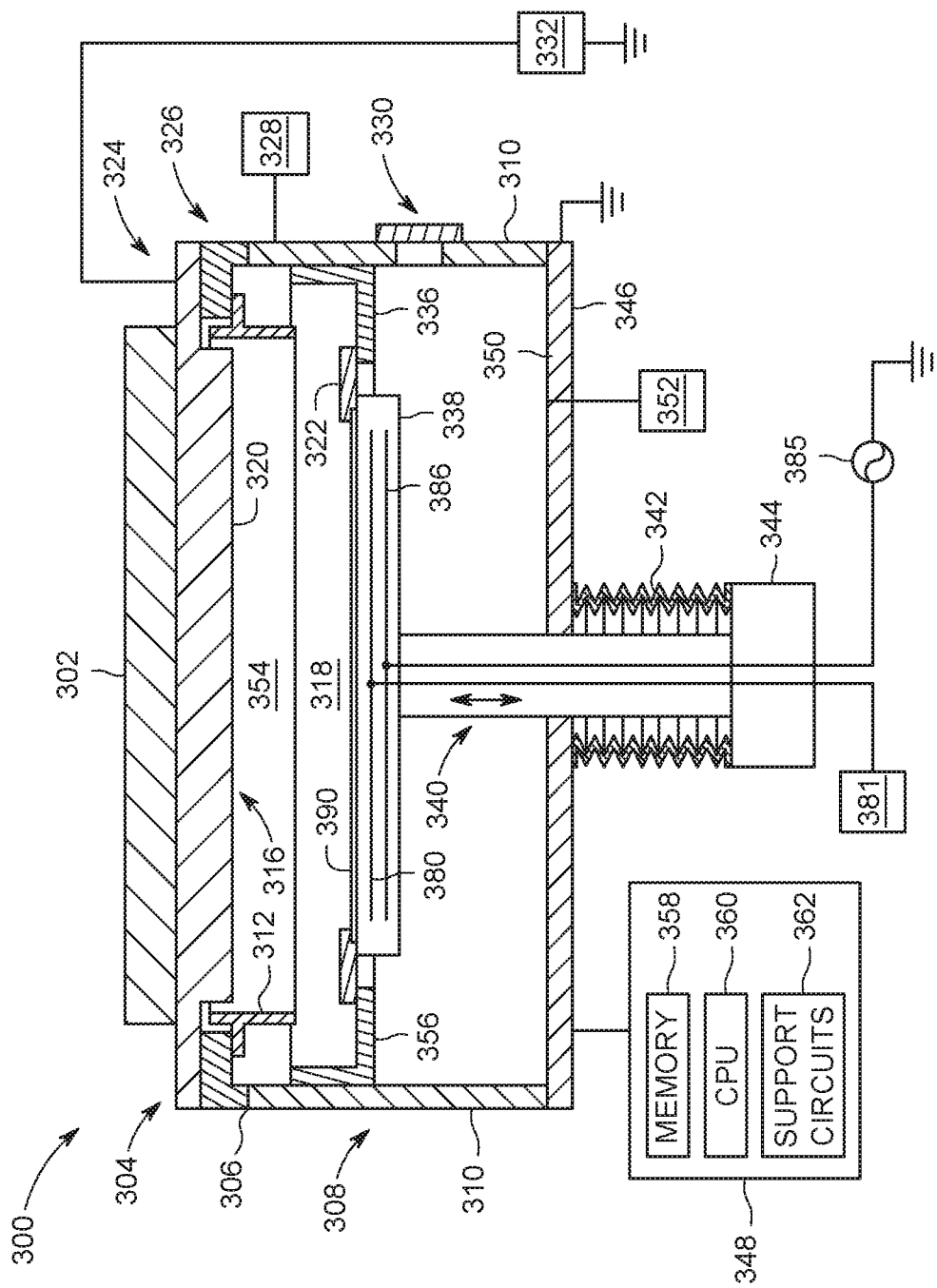
FIG. 3 is a schematic cross-sectional view of one embodiment of a process chamber suitable for depositing in accordance with the present disclosure.

Referring now to FIG. 3, an exemplary physical vapor deposition (PVD) process chamber 300 (e.g., a sputter process chamber) suitable for sputter depositing materials using a high-power impulse magnetron sputtering (HiPIMS) process in accordance with an embodiment of the present disclosure. In some embodiments, process chamber 300 is configured to deposit a first metal layer of ruthenium, molybdenum, iridium, platinum or rhodium atop a second metal layer different than the first metal layer. In some embodiments, the first metal layer is deposited to a thickness of 10 to 500 nanometers, 10 to 400 nanometers, or 10 to 300 nanometers. In embodiments, process chamber 300 is a PVD process chamber, available from Applied Materials, Inc., located in Santa Clara, Calif. Other sputter process chambers, including those from other manufactures, may be adapted to practice embodiments of the present disclosure.

In some embodiments, process chamber 300 includes a chamber body 308 having a processing volume 318 defined therein. The chamber body 308 has sidewalls 310 and a bottom 346. The dimensions of the chamber body 308 and related components of the process chamber 300 are not limited and generally are proportionally larger than the size of the substrate 390 to be processed. Any suitable substrate size may be processed. Examples of suitable substrate sizes include substrate with 200 mm diameter, 300 mm diameter, 450 mm diameter or larger.

A chamber lid assembly 304 is mounted on the top of the chamber body 308. The chamber body 308 may be fabricated from aluminum or other suitable materials. A substrate access port 330 is formed through the sidewall 310 of the chamber body 308, facilitating the transfer of a substrate 390 into and out of the process chamber 300. The access port 330 may be coupled to a transfer chamber and/or other chambers of a substrate processing system.

A gas source 328 is coupled to the chamber body 308 to supply process gases into the processing volume 318. In one embodiment, process gases may include inert gases, non-reactive gases, and reactive gases if necessary. Examples of process gases that may be provided by the gas source 328 include, but not limited to, argon gas (Ar), helium (He), neon gas (Ne), krypton (Kr), xenon (Xe), nitrogen gas ($N_2$), oxygen gas ($O_2$), hydrogen gas ($H_2$), forming gas ($N_2+H_2$), ammonia ($NH_3$), methane ($CH_4$), carbon monoxide (CO), and/or carbon dioxide ($CO_2$), among others.

A pumping port 350 is formed through the bottom 346 of the chamber body 308. A pumping device 352 is coupled to the processing volume 318 to evacuate and control the pressure therein. A pumping system and chamber cooling design enables high base vacuum (e.g., 1 E-8 Torr or less) and low rate-of-rise (e.g., 1,000 mTorr/min) at temperatures (e.g., 25 degrees Celsius to 600 degrees Celsius) suited to thermal budget needs. The pumping system is designed to provide precise control of process pressure which is a critical parameter for crystal structure (e.g., Sp3 content), stress control and tuning. Process pressure may be maintained in the range of between about 1 mTorr and about 500 mTorr, such as between about 50 mTorr and about 500 mTorr.

The lid assembly 304 generally includes a target 320 and a ground shield assembly 326 coupled thereto. The target 320 provides a material source that can be sputtered and deposited onto the surface of the substrate 390 during a PVD process. Target 320 serves as the cathode of the plasma circuit during, for example, DC sputtering.

The target 320 or target plate may be fabricated from a material utilized for the deposition layer, or elements of the deposition layer to be formed in the chamber, such as metallic materials. A high voltage power supply, such as a power source 332, is connected to the target 320 to facilitate sputtering materials from the target 320. In one embodiment, the target 320 may be fabricated from a metallic material, such as ruthenium, molybdenum, iridium, platinum or rhodium, or the like. The power source 332, or power supply, can provide power to the target in a pulsed (as opposed to constant) manner. That is, the power supply can provide power to the target by providing three or more (several) pulses to the target 320.

The target 320 generally includes a peripheral portion 324 and a central portion 316. The peripheral portion 324 is disposed over the sidewalls 310 of the chamber. The central portion 316 of the target 320 may have a curvature surface slightly extending towards the surface of the substrate 390 disposed on a substrate support 338. In typical PVD processing, the spacing between the target 320 and the substrate support 338 is maintained between about 50 mm and about 250 mm. The dimension, shape, materials, configuration, and diameter of the target 320 may be varied for specific process or substrate requirements. In one embodiment, the target 320 may further include a backing plate having a central portion bonded and/or fabricated by a material desired to be sputtered onto the substrate surface.

The lid assembly 304 may further comprise a full-face erosion magnetron cathode 302 mounted above the target 320 which enhances efficient sputtering materials from the target 320 during processing. The full-face erosion magnetron cathode 302 allows easy and fast process control and tailored film properties while ensuring consistent target erosion and uniform deposition across the wafer. Examples of a magnetron assembly include a linear magnetron, a serpentine magnetron, a spiral magnetron, a double-digitated magnetron, a rectangularized spiral magnetron, among others shapes to form a desired erosion pattern on the target face and enable a desirable sheath formation during pulsed or DC plasma stages of the process. In some configurations, the magnetron may include permanent magnets that are positioned in a desirable pattern over a surface of the target, such as one of the patterns described above (e.g., linear, serpentine, spiral, double digitated, etc.). In other embodiments, a variable magnetic field type magnetron having a desirable pattern may alternately, or even in addition to permanent magnets, be used to adjust the shape and/or density of the plasma throughout one or more portions of a HIPMS process.

The ground shield assembly 326 of the lid assembly 304 includes a ground frame 306 and a ground shield 312. The ground shield assembly 326 may also include other chamber shield member, target shield member, dark space shield, and dark space shield frame. The ground shield 312 is coupled to the peripheral portion 324 by the ground frame 306 defining an upper processing region 354 below the central portion of the target 320 in the processing volume 318. The ground frame 306 electrically insulates the ground shield 312 from the target 320 while providing a ground path to the chamber body 308 of the process chamber 300 through the sidewalls 310. The ground shield 312 constrains plasma generated during processing within the upper processing region 354 and dislodges target source material from the confined central portion 316 of the target 320, thereby allowing the dislodged target source material to be mainly deposited on the substrate surface rather than chamber sidewalls 310.

In the embodiment of FIG. 3, a shaft 340 extending through the bottom 346 of the chamber body 308 couples to a lift mechanism 344. The lift mechanism 144 is configured to move the substrate support 338 between a lower transfer position and an upper processing position. A bellows 342 circumscribes the shaft 340 and coupled to the substrate support 338 to provide a flexible seal there between, thereby maintaining vacuum integrity of the chamber processing volume 318.

The substrate support 338 may be an electro-static chuck and have an electrode 380. The substrate support 338, when using the electro-static chuck (ESC) embodiment, uses the attraction of opposite charges to hold both insulating and conducting type substrates 390 and is powered by DC power supply 381. The substrate support 338 can include an electrode embedded within a dielectric body. The DC power supply 381 may provide a DC chucking voltage of about 200 to about 2000 volts to the electrode. The DC power supply 381 may also include a system controller for controlling the operation of the electrode 380 by directing a DC current to the electrode for chucking and de-chucking the substrate 390.

After the process gas is introduced into the process chamber 300, the gas is energized to form plasma so that the HIPIMS type PVD process can be performed.

A shadow frame 322 is disposed on the periphery region of the substrate support 338 and is configured to confine deposition of source material sputtered from the target 320 to a desired portion of the substrate surface. A chamber shield 336 may be disposed on the inner wall of the chamber body 308 and have a lip 356 extending inward to the processing volume 318 configured to support the shadow frame 322 disposed around the substrate support 338. As the substrate support 338 is raised to the upper position for processing, an outer edge of the substrate 390 disposed on the substrate support 338 is engaged by the shadow frame 322 and the shadow frame 322 is lifted and spaced away from the chamber shield 336. When the substrate support 338 is lowered to the transfer position adjacent to the substrate transfer access port 330, the shadow frame 122 is set back on the chamber shield 336. Lift pins (not shown) are selectively moved through the substrate support 1338 to list the substrate 390 above the substrate support 338 to facilitate access to the substrate 1390 by a transfer robot or other suitable transfer mechanism.

A controller 348 is coupled to the process chamber 300. The controller 348 includes a central processing unit (CPU) 360, a memory 358, and support circuits 362. The controller 348 is utilized to control the process sequence, regulating the gas flows from the gas source 328 into the process chamber 300 and controlling ion bombardment of the target 320. The CPU 360 may be of any form of a general-purpose computer processor that can be used in an industrial setting. The software routines can be stored in the memory 358, such as random-access memory, read only memory, floppy or hard disk drive, or other form of digital storage. The support circuits 362 are conventionally coupled to the CPU 360 and may comprise cache, clock circuits, input/output subsystems, power supplies, and the like. The software routines, when executed by the CPU 360, transform the CPU into a specific purpose computer (controller) 348 that controls the process chamber 300, such that the processes are performed in accordance with the present principles. The software routines may also be stored and/or executed by a second controller (not shown) that is located remotely from the process chamber 300.

During processing, material is sputtered from the target 320 and deposited on the surface of the substrate 390 (or as shown in FIG. 7A atop a second metal layer 704 atop a substrate 702). In some configurations, the target 320 is biased relative to ground or substrate support, by the power source 332 to generate and maintain a plasma formed from the process gases supplied by the gas source 328. The ions generated in the plasma are accelerated toward and strike the target 320, causing target material to be dislodged from the target 320. The dislodged target material forms a layer on the substrate 390 with a desired crystal structure and/or composition. RF, DC or fast switching pulsed DC power supplies or combinations thereof provide tunable target bias for precise control of sputtering composition and deposition rates for the target material.

In some embodiments, the processing conditions are suitable to increase the grain size of the metal material sputtered from the target. Non-limiting examples of conditions suitable for increasing the grain size of metal material deposited from the target include utilizing a process gas including argon, and/or krypton at a pressure of 50 mTorr to 500 mTorr and temperature from 20 degrees Celsius to 600 degrees Celsius. In embodiments, a sputter source plasma is provided at 500 W to 10 kW with optional bias power between 0 W to 500 W.

In some embodiments, separately applying a bias to the substrate during different phases of the film layer deposition process is also desirable. Therefore, a bias may be provided to a bias electrode 386 (or chuck electrode 380) in the substrate support 338 from a source 385 (e.g., DC and/or RF source), so that the substrate 390 will be bombarded with ions formed in the plasma during one or more phases of the deposition process. In some process examples, the bias is applied to the substrate after the film deposition process has been performed. Alternately, in some process examples, the bias is applied during the film deposition process. A larger negative substrate bias will tend to drive the positive ions generated in the plasma towards the substrate or vice versa, so that they have a larger amount of energy when they strike the substrate surface.

Referring back to the embodiment of FIG. 3, the power source 332 of the embodiment of FIG. 3 is a HIPIMS power supply configured to deliver power impulses to the target 320 with high current and high voltage over short durations within a range of frequencies. In some embodiments, performing a high-power impulse magnetron sputtering PVD process in which high current and high voltage pulses within a specific range of low pulse frequencies are provided to a target, such as a ruthenium, molybdenum, iridium, platinum or rhodium target, along with providing a substrate bias to the substrate 390 being processed improves a bottom coverage of deposited films in features of the substrate.

In some embodiments, when the high current and high voltage pulses in the ranges of between about from 50 amps-1000 amps and 600 volts-1500 volts the HIPIMS power supply such as power source 332 are delivered to the target 320 at a range of low frequencies of between about 100 Hz-5 kHz, a higher ion/neutrals ratio of sputtered target material is generated. The high voltage, high current pulses at the low frequencies generate high peak power which assists in ionizing the sputtered atoms. The resulting high ion fraction pulse to the substrate, combined with a substrate bias of between about 20 W and 300 W at 13.56 Mhz, or 0 and 500 W at 13.56 Mhz enhances the material flux into the features (vias/trenches) of the substrate 390, increasing the bottom coverage of a resulting film layer.

In embodiments, process chamber 300 is configured to operate under conditions sufficient to modulate grain size or promote enlargement of a deposited metal material grain size including: a pressure of 5 mTorr to 500 mTorr, and a temperature between 25 degrees Celsius and 600 degrees Celsius, such as 300 degrees Celsius to 500 degrees Celsius. In embodiments, a sputter source plasma is applied at 500 W to 10 kW. In embodiments, an optional bias power is applied between 0 W to 500 W. In embodiments, the target includes ruthenium, molybdenum, iridium, platinum or rhodium metal. In embodiments, the target includes a noble metal.

Figure 4:
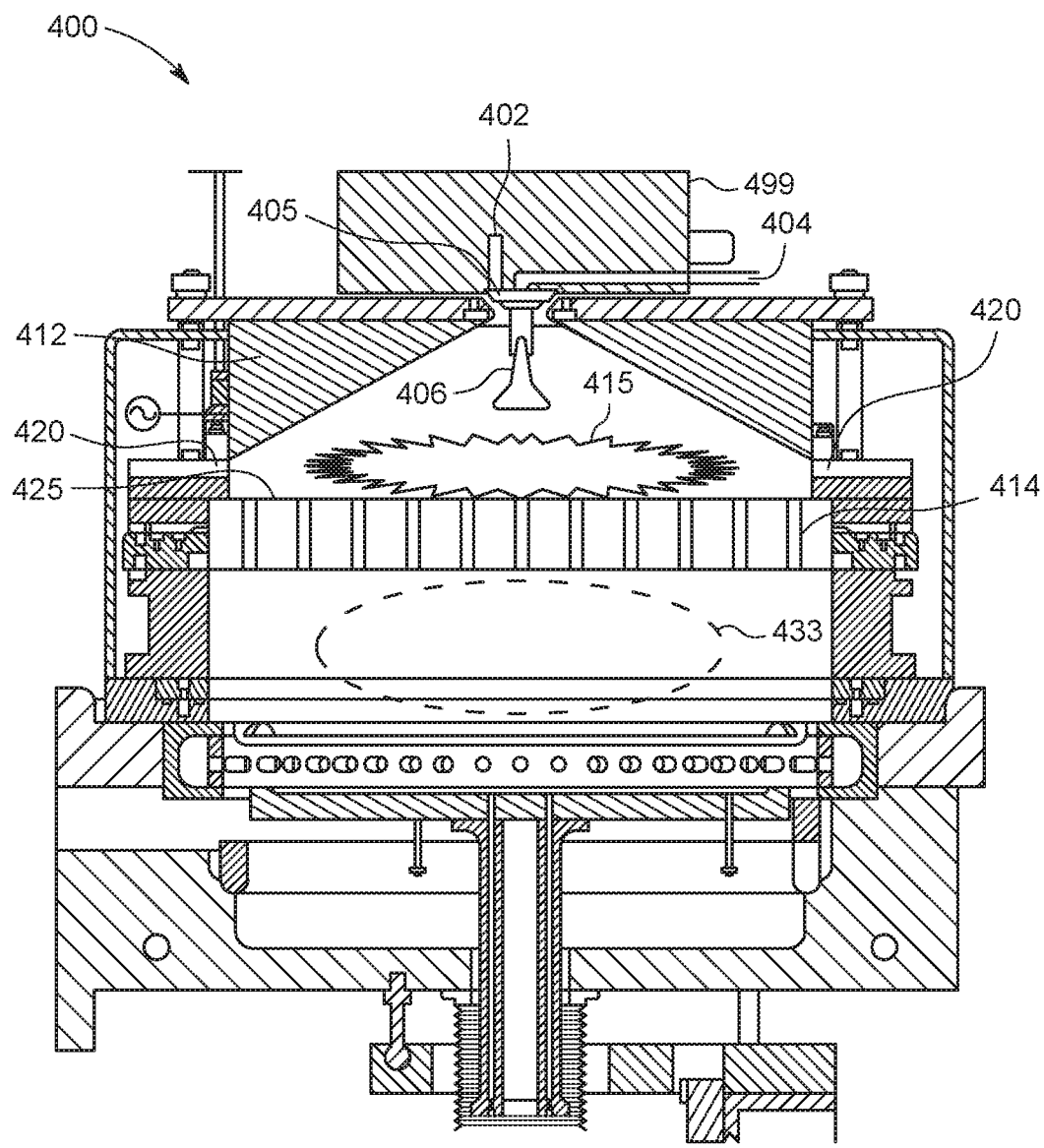
FIG. 4 is a schematic cross-sectional view of one embodiment of a process chamber suitable for depositing in accordance with the present disclosure.

FIG. 4 is a cross-sectional view of one embodiment of a flowable chemical vapor deposition chamber such as process chamber 400 with partitioned plasma generation regions. The flowable chemical vapor deposition chamber such as process chamber 400 may be utilized to deposit a metal layer, such as a first metal layer or second metal layer onto a substrate. During metal film deposition, a process gas may be flowed into a first plasma region 415 through a gas inlet assembly 405. The process gas may be excited prior to entering the first plasma region 415 within a remote plasma system (RPS) 499. The process chamber 400 includes a lid 412 and showerhead 425. The lid 412 is depicted with an applied AC voltage source and the showerhead 425 is grounded, consistent with plasma generation in the first plasma region 415. An insulating ring 420 is positioned between the lid 412 and the showerhead 425 enabling a capacitively coupled plasma (CCP) to be formed in the first plasma region 415. The lid 412 and showerhead 425 are shown with an insulating ring 420 in between, which allows an AC potential to be applied to the lid 412 relative to the showerhead 425.

In some embodiments, lid 412 may be a dual-source lid for use with a processing chamber. Two distinct gas supply channels are visible within the gas inlet assembly 405. A first channel 402 carries a gas that passes through the remote plasma system (RPS) 499, while a second channel 404 bypasses the RPS 499. The first channel 402 may be used for the process gas and the second channel 404 may be used for a treatment gas. The gases that flow into the first plasma region 415 may be dispersed by a baffle 406.

In some embodiments, a fluid, such as a precursor, may be flowed into a second plasma region 433 of the process chamber 400 through the showerhead 425. Excited species derived from the precursor in the first plasma region 415 travel through apertures 414 in the showerhead 425 and react with the precursor flowing into the second plasma region 433 from the showerhead 425. Little or no plasma is present in the second plasma region 433. Excited derivatives of the precursor combine in the second plasma region 433 to form a flowable dielectric material on the substrate. As the dielectric material grows, more recently added material possesses a higher mobility than underlying material. Mobility decreases as organic content is reduced by evaporation.

In some embodiments, exciting a precursor in the first plasma region 415 alone or in combination with the remote plasma system (RPS) 499 provides several benefits. The concentration of the excited species derived from the precursor may be increased within the second plasma region 433 due to the plasma in the first plasma region 415. This increase may result from the location of the plasma in the first plasma region 415. The second plasma region 433 is located closer to the first plasma region 415 than the remote plasma system (RPS) 499, leaving less time for the excited species to leave excited states through collisions with other gas molecules, walls of the chamber and surfaces of the showerhead.

In some embodiments, the uniformity of the concentration of the excited species derived from the precursor may also be increased within the second plasma region 433. This may result from the shape of the first plasma region 415, which is more like the shape of the second plasma region 433. Excited species created in the remote plasma system (RPS) 499 travel greater distances in order to pass through apertures 414 near the edges of the showerhead 425 relative to species that pass-through apertures 414 near the center of the showerhead 425. The greater distance results in a reduced excitation of the excited species and, for example, may result in a slower growth rate near the edge of a substrate. Exciting the precursor in the first plasma region 415 mitigates this variation.

In addition to the precursors, other gases may be introduced at varied times for varied purposes. A treatment gas may be introduced to remove unwanted impurities such as residuals, reaction byproducts or species such as hydrogen, carbon, halogens such as chlorine and fluorine from the chamber walls, the substrate, the deposited film and/or the film during deposition. Other impurities suitable for being removed in accordance with the present disclosure include carbon-containing impurities including carbon atoms, oxygen-containing impurities including oxygen atoms, halocarbons and the like from the deposited film and/or the film during deposition. In some embodiments, impurities are removed to levels below 1%, or below 0.1%. In some embodiments, impurities are removed to below 0.1% by total weight of the film such as a metal layer in accordance with the present disclosure. In some embodiments, impurities are removed to a level below 1000 ppm, or below 100 ppm, or between 10 ppm and 100 ppm.

In some embodiments, the treatment gas may include at least one of the gases from the group comprising of hydrogen ($H_2$) an $H_2/N_2$ mixture, ammonia ($NH_3$), ammonia hydroxide ($NH_4OH$), ozone ($O_3$), oxygen ($O_2$), hydrogen peroxide ($H_2O_2$) and water vapor. A treatment gas may be excited in a plasma and then used to reduce or remove a impurities such as residuals, or residual organic content from the deposited film. In other embodiments, the treatment gas may be used without a plasma. When the treatment gas includes water vapor, the delivery may be achieved using a mass flow meter (MFM) and injection valve or by other suitable water vapor generators. In some embodiments, the treatment gas may be introduced from into the first processing region, either through the RPS unit or bypassing the RPS unit and may further be excited in the first plasma region.

Figure 5:
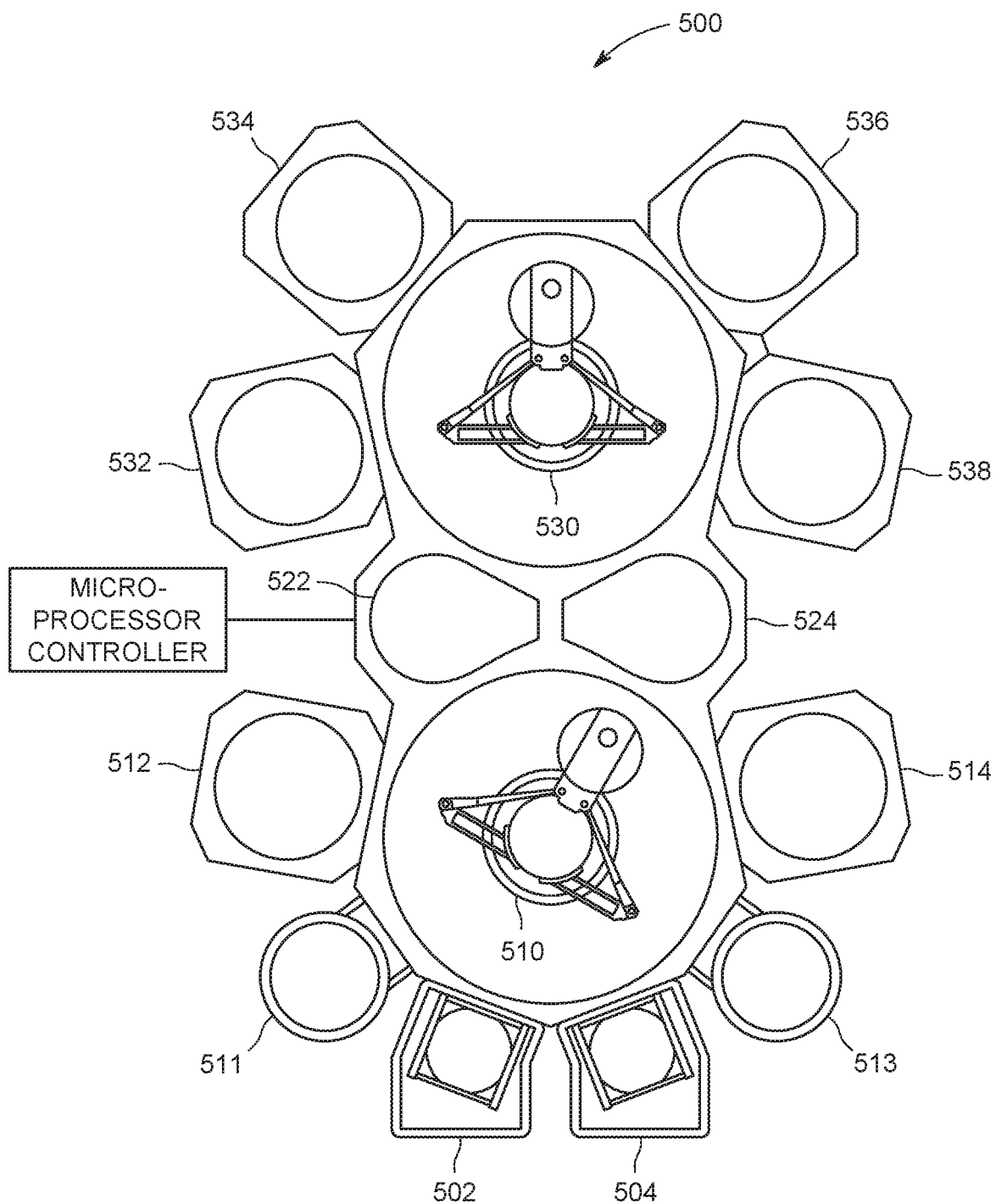
FIG. 5 depicts a schematic top-view diagram of an illustrative multi-chamber processing system.

Referring now to FIG. 5, a schematic top-view diagram of an illustrative multi-chamber processing system such as system 500 that can be adapted to perform processes as disclosed herein having the processing chamber such as system 500 coupled thereto. The system 500 may include multiple processing chambers, such as the processing chambers 100, 200, 300, 400 depicted in FIGS. 1-4, incorporated into the system 500. The system 500 can include one or more load lock chambers 502, 504 for transferring substrates into and out of the system 500. Typically, since the system 500 is under vacuum, the load lock chambers 502, 504 can "pump down" the substrates being introduced into the system 500. A first robot 510 can transfer the substrates between the load lock chambers 502, 504, and a first set of one or more substrate processing chambers such as processing chambers 511, 512, 513, 514 (four are shown). Each processing chamber 511, 512, 513, 514 is configured to perform at least one of substrate processing operation, such as an etching process, treatment process, flowable chemical vapor deposition (CVD), physical vapor deposition (PVD), degas, pre-cleaning, orientation and other substrate processes including processes of the present disclosure. The position of the processing chambers 511, 512, 513, 514 utilized to perform the processes relative to the other processing chambers 100, 200, 300, 400 is for illustration, and the position of the processing chambers 100, 200, 300, 400 may be optionally be switched with any one of the processing chambers 511, 512, 513, 514 if desired. As discussed above, the processing chambers 100, 200, 300, 400 as depicted above with reference above to FIGS. 1-4 are configured to perform at least one of substrate processing operation, such as an etching process, treatment process, flowable chemical vapor deposition (CVD), physical vapor deposition (PVD), degas, pre-cleaning, orientation and other substrate processes.

In some embodiments, a first robot 510 can also transfer substrates to/from one or more transfer chambers 522, 524. The transfer chambers 522, 524 can be used to maintain ultra-high vacuum conditions while allowing substrates to be transferred within the system 500. A second robot 530 can transfer the substrates between the transfer chambers 522, 524 and the second set of the one or more processing chambers 532, 534, 536, 538. Similar to processing chambers 511, 512, 513, 514, the processing chambers 532, 534, 536, 538 can be outfitted to include chambers 100, 200, 300, 400 to perform a variety of substrate processing operations including the etch processes described herein any other suitable process including an etching process, cyclical layer deposition (OLD), atomic layer deposition (ALD), treatment process, cyclical etching process, plasma enhanced chemical vapor deposition (PE CVD), flowable chemical vapor deposition (CVD), physical vapor deposition (PVD), degas, pre-cleaning, orientation and other substrate processes, for example. Any of the processing chambers 511, 512, 513, 514, 532, 534, 536, 538 can be removed from the system 500 if not necessary for a process to be performed by the system 500. In some embodiments, the methods of the present disclosure can be performed in an individual thermal processing chamber such as the chambers described above.

In some embodiments, a system 500 includes a plurality of thermal processing chambers, or processing chambers. In embodiments, the system 500 is a substrate processing system, including: a physical vapor depositing chamber configured for depositing a first metal layer on a substrate and for increasing a grain size of a metal of the first metal layer; and a thermal processing chamber configured for treating and annealing the first metal layer to remove impurities and increase the grain size of the metal. In some embodiments, the substrate processing system, further includes: a vacuum substrate transfer chamber, wherein the physical vapor depositing chamber is coupled to the vacuum substrate transfer chamber, wherein the thermal processing chamber is coupled to the vacuum substrate transfer chamber, and wherein the substrate processing system is configured to move a substrate from the physical vapor depositing chamber to the thermal processing chamber under vacuum. In some embodiments, the substrate processing system further includes: an etch chamber configured to etch the first metal layer to form a metal line.

Figure 6:
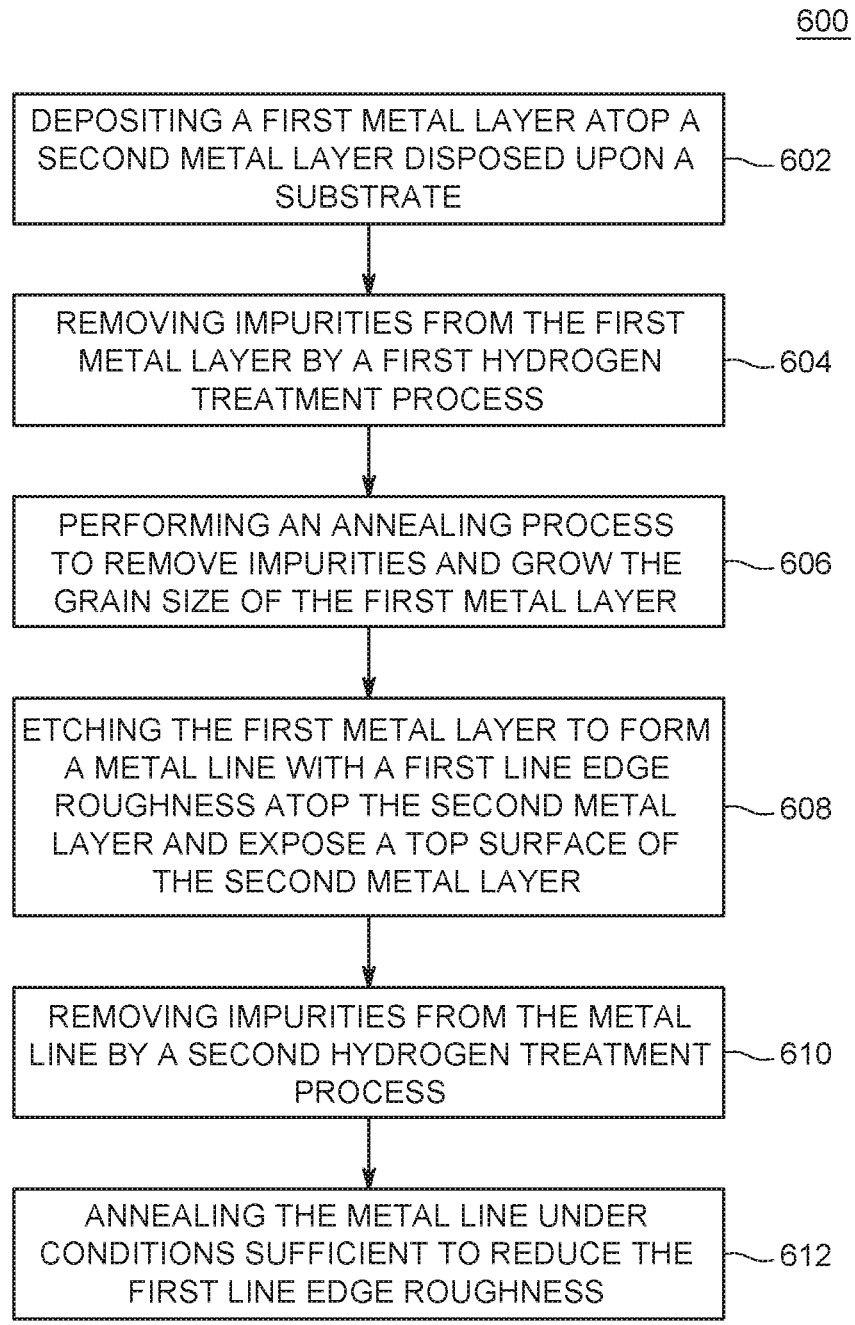
FIG. 6 depicts a flow diagram of a method for patterning an interconnection structure in accordance with the present disclosure.
Figure 7B:
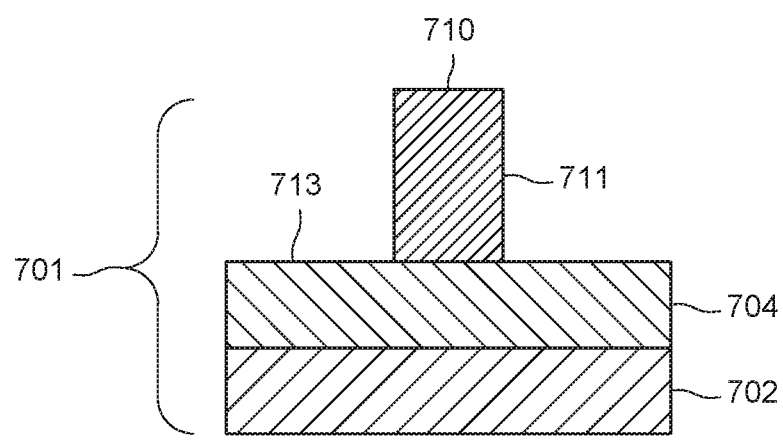

Referring now to FIG. 6, the method 600 of the present disclosure for patterning or manufacturing an interconnection structure for semiconductor devices is shown. The method 600 for patterning or manufacturing the interconnection structure may include several process steps of different techniques, such as a deposition process, a post-deposition treatment process such as a treatment process and annealing process, an etching process, a post-etch treatment process, and post-etch annealing process as needed. The method 600 may be performed in a processing system (i.e., a cluster system), such as the system 500 depicted in FIG. 5. FIGS. 7A-7B are schematic cross-sectional view illustrating a sequence for manufacturing embodiments of interconnection structures disposed on a substrate according to the method 600. Although the method 600 is described below with reference to a substrate having a first metal layer 706 disposed upon a second metal layer 704 utilized to form an interconnection structure, the method 600 may also be used to advantage in other transistor device manufacture applications.

In embodiments, the method 600 begins at process sequence 602 by depositing a first metal layer 706 atop a second metal layer 704 disposed upon a substrate 702. In embodiment, the substrate 702 is transferred into a processing chamber, such as the processing chamber 300 in FIG. 3, or process chamber 400 in FIG. 4. In embodiments, the substrate 702 may be a silicon-based material or any suitable insulating materials or conductive materials as needed, having a second metal layer 704 disposed on the substrate 702 that may be utilized to form an interconnection structure 700 as shown in FIG. 7A. In embodiments, substrate 702 may be disposed in a film stack 701 including one or more additional layers such as an interface layer which may include different structures formed thereon, such as front-end structure, back end structure, contact structure, metal conductive structures, insulating structures or the like formed therein as needed. In embodiments, an interface layer may be a conductor layer, or a dielectric layer as needed.

In some embodiments, the film stack 701 includes a first metal layer 706, second metal layer 704, and substrate 702. In embodiments, first metal layer 706, second metal layer 704, may be made by similar or the same material, or first metal layer 706, and second metal layer 704 may be made of different materials. In embodiments, first metal layer 706, and second metal layer 704 are made of molybdenum, ruthenium, iridium, platinum, or rhodium. In some embodiments, the first metal layer includes a different metal than the second metal layer.

In some embodiments, the first metal layer 706 may be deposited atop the second metal layer 704 by a physical vapor deposition (PVD) process using a process chamber such as process chamber 300 described above. For example, during operation, first metal layer 706 is deposited atop the second metal layer 704 disposed on the substrate 702. In embodiments, first metal layer 706 is deposited to a predetermined thickness such as 20 nanometers to 1000 nanometers. In embodiments, a process gas and/or gas mixture is contacted with the film stack 701 in a process chamber such as process chamber 300 under conditions suitable for forming the first metal layer 706. In embodiments, the process conditions may include a pressure of 50 mTorr to 500 mTorr at a temperature of 20 degrees Celsius to 600 degrees Celsius, or a temperature between 300 degrees Celsius and 500 degrees Celsius. In embodiments, a sputter source plasma is applied at 500 W to 10 kW, and a bias power of 0 W to 500 W is optionally applied to the film stack 701. In embodiments, a process gas may include gases suitable for a PVD process as described above.

In some embodiments, the first metal layer 706 may be deposited atop the second metal layer 704 by a chemical vapor deposition (CVD) process. For example, during operation, first metal layer 706 is deposited atop the second metal layer 704 disposed on the substrate 702 in a process chamber such as process chamber 400 of FIG. 4. A process gas and/or gas mixture including metal precursors are contacted with the film stack 701 in a process chamber such as process chamber 400 under conditions suitable for forming the first metal layer 706.

Still referring to FIG. 6, method 600 may optionally include at process sequence 604 removing impurities such as residuals and/or reaction byproducts and/or residual organic materials from the first metal layer 706 by a first hydrogen treatment process. In some embodiments, the impurity removal process is a hydrogen treatment process performed by supplying an impurity removal gas mixture including a hydrogen containing gas to the substrate or film stack 701 to remove impurity materials such as reaction byproducts and residual organics therefrom. In some embodiments, the impurity removal gas mixture includes a hydrogen containing gas and optionally an inert gas. Suitable examples of the hydrogen containing gas include $H_2$, $H_2O$, $H_2O_2$, $NH_3$, and the like.

In some embodiments, while performing process sequence 604, exposed surface 707 is exposed to reactive species from the residual removal gas mixture. Thus, the reactive species for performing the residual removal process are selected to have high selectivity among these materials, so that the reactive species can selectively remove the residuals. In one embodiment, a hydrogen containing gas supplied from a remote plasma source is provided to selectively remove the residuals. Nitrogen containing gas, such as $N_2$, $N_2O$, $NO_2$, $NH_3$, may also be optionally supplied in the residual removal gas mixture. In some embodiments, the residual removal gas mixture includes $H_2$ and $N_2$.

In some embodiments, while performing process sequence 604, several process parameters may also be regulated. In some embodiments, a process pressure in the processing chamber 300 is regulated between about 10 mTorr and about 500 mTorr, such as between about 100 mTorr and about 300 mTorr. A remote plasma source and/or an optional RF bias power may be utilized the residual removal process. The power supplied to the remote plasma source may be between 200 Watts and about 30,000 Watts, such as about 5000 Watts. In one example, the RF bias power is not applied while supplying the residual removal gas mixture. The elimination of the RF bias power while performing the residual removal process can assist the reactive species in the plasma generated from the impurity removal gas mixture to be more uniformly distributed across the substrate surface with relatively gentle power without specific directionality.

In some embodiments, a hydrogen containing gas from the impurity removal gas mixture may be flowed into the chamber at a rate by volume between about 500 sccm to about 2000 sccm and the nitrogen containing gas may be supplied at a rate by volume between about 500 sccm to about 2000 sccm. The hydrocarbon containing gas and the nitrogen containing gas from the impurity removal gas mixture may be supplied simultaneously to the processing chamber or alternatively or sequentially supplied as needed.

In some embodiments, a substrate temperature is maintained at greater than 100 degrees Celsius, such as between about 20 degrees Celsius to about 600 degrees Celsius, such as between about 150 degrees Celsius and about 350 degrees Celsius, for example between about 200 degrees Celsius and about 300 degrees Celsius. In some embodiments, the high temperature control of the substrate during the impurity removal process may assist and evaporate polymer materials from layers such as sacrificial layers, so as to enhance the removal efficiency without damaging other materials on the substrate.

Still referring to FIG. 6, method 600 may optionally include at process sequence 606 performing an anneal process to remove impurities and grow the grain size of the first metal layer 706. For example, process sequence 606 includes annealing the first metal layer 706 at a pressure at or between 760 Torr to 76,000 Torr. In some embodiments, the annealing process at process sequence 606 is a high-pressure annealing process performed at high process pressure, such as a pressure from between about 7,600 and about 37,500 Torr, such as from between about 15,000 and about 37,500 Torr. The high-pressure annealing process may assist removing impurities such as residuals and increasing the grain size of the first metal layer 706 metal. In some embodiments, the high process pressure may go up to 76,000 Torr. The high-pressure annealing process may be performed at a processing chamber, such as the processing chamber 200 depicted in FIG. 2, or other suitable processing chambers, including those that process substrate one at a time.

In some embodiments, a high-pressure annealing process performed at process sequence 606 maintains processing pressure at the high-pressure region in a vapor phase, for example in a dry vapor phase that has substantially no liquid droplets present. The processing pressure and temperature is controlled to density the film structures, to drive out impurities and increasing grain size. In one embodiment, the high-pressure region or internal volume 215 (as shown in FIG. 2) is pressurized to a pressure greater than atmosphere, for example greater than about 1,400 Torr. In another example, the high-pressure region or internal volume 215 is pressurized to a pressure from about 760 to about 76,000 Torr, such as between about 7,600 and about 37,500 Torr, or between about 15,000 and about 36,000 Torr. As the high pressure may efficiently assist densifying the film structure, a relatively low processing temperature, such as less than 600 degrees Celsius, to reduce likelihood of thermal cycle damage to the substrate or film stack 701.

In some embodiments, during processing, the high-pressure region or internal volume 215 is maintained at a relatively low temperature, for example, a temperature less than 600 degrees Celsius, such as between about 300 degrees Celsius and about 600 degrees Celsius, by the heaters disposed within the outer chamber. Thus, a low thermal budget to the substrate may be obtained by utilizing the high-pressure annealing process along with low temperature regime.

In some embodiments, at process sequence 606, a hydrogen or nitrogen containing gas, such as $H_2$, $H_2O$, $H_2O_2$, $N_2O$, $NO_2$, $NH_3$, and dry steam, may be supplied during the annealing process. An inert gas, such as He and Ar, may also be supplied during the annealing process.

In some embodiments, a process pressure is regulated at a pressure greater than 760 Torr, such as between 760 Torr and 76,000 Torr. The process temperature may be controlled and rapidly ramped-up to 300 degrees Celsius but less than 600 degrees Celsius.

After the annealing process at high pressure, the first metal layer 706 has an improved film structure with high purity, and large grain structure, which provides a relatively robust film structure that provides higher film density and low film resistivity is obtained. In some embodiments, first metal layer 706 is ruthenium (Ru) or Ru containing material, the film resistivity for the Ru containing material may be reduced between about 3% and about 7% after the high-pressure annealing process. In some embodiments, the film resistivity is reduced by 1 to 50%, 5 to 50%, 10 to 50%, 20 to 50% after the high-pressure annealing process of a metal in accordance with the present disclosure.

Still referring to FIG. 6, method 600 may optionally include at process sequence 608 a main etching process to etch the first metal layer 706 until the underlying second metal layer 704 is exposed, as shown in FIG. 7B. For example, FIG. 7B shows etching the first metal layer 706 to form a metal line 710 with a first surface 711 having a line edge roughness atop the second metal layer 704 and expose a top surface 713 of the second metal layer 704. In some embodiments, the main etching process is performed by supplying a main etching gas mixture to the processing chamber, such as the processing chamber 100 depicted in FIG. 1, to etch the first metal layer 706.

In some embodiments, etching at process sequence 608 includes three steps including a break-through process, a bulk etching process, and a residual clean process. In some embodiments, the main etching process as performed is highly selective so that the reactive species from the main etching process can predominately etch the first metal layer 706 without substantially attacking the second metal layer 704 when exposed. In embodiments, a selective etching process can preferentially etch a target material (such as the metal of first metal layer 706 without attacking or damaging the nearby material).

In some embodiments, a main etching gas mixture includes a halogen containing gas, such as a chlorine containing gas. An inert gas may also be supplied in the main etching gas mixture. Suitable examples of the chlorine containing gas include chlorine ($Cl_2$), hydrogen chloride (HCl) and the like. In one example, the main etching gas mixture includes a chlorine containing gas, such as chlorine ($Cl_2$) gas, and an argon (Ar) gas.

During the process sequence 608 (optionally including the break-through process, bulk etching process, and the residual clean process), several process parameters may also be regulated. In one exemplary embodiment, a process pressure in the processing chamber 100 is regulated between about 10 mTorr and about 5000 mTorr, such as between about 10 mTorr and about 200 mTorr. A RF source and/or bias power may be utilized while performing the flash etching process. The RF source and the RF bias power may be applied to the processing chamber in continuous mode or in pulsed mode. In one example, the RF bias power is applied while supplying the main etching gas mixture. In some embodiments, the RF bias power applied when supplying the main etching gas mixture. In one example, the RF source power at a frequency of about 13 MHz may be applied to maintain a plasma in the gas mixture. For example, a RF source power of about 100 Watts to about 1000 Watts may be applied to maintain a plasma inside the processing chamber 100. A RF bias power of about 300 Watts (W) and about 700 W may be applied while supplying the main etching gas mixture. In some embodiments, a substrate temperature is maintained between about 10 degrees Celsius to about 300 degrees Celsius, such as between about 20 degrees Celsius and about 80 degrees Celsius, for example between about 30 degrees Celsius and about 50 degrees Celsius.

In embodiments, metal line 710 is formed atop second metal layer 704. In some embodiments, the metal line 710 has an aspect ratio 0.5 to 1, or in some embodiments about 20:1, 15:1, 10:1. 5:1 and the like. In some embodiments, the width of the metal line is 3 nanometers to 1 micron, or 3 nanometers to 500 nanometers, or 3 nanometers to 100 nanometers, or 3 nanometers to 50 nanometers, or 3 nanometers to 10 nanometers. In some embodiments, the width of the metal line is 5 to 150 nanometers.

Still referring to FIG. 6, method 600 may optionally include at process sequence 610 removing impurities such as residuals from the metal line 710 by a first hydrogen treatment process. In some embodiments, the impurity removal process is a hydrogen treatment process performed by supplying an impurity removal gas mixture including a hydrogen containing gas to the substrate or film stack 701 to remove impurities such as organics therefrom. In some embodiments, the impurity removal gas mixture includes a hydrogen containing gas and optionally an inert gas. Suitable examples of the hydrogen containing gas include hydrogen ($H_2$), water ($H_2O$), hydrogen peroxide ($H_2O_2$), ammonia ($NH_3$), and the like.

In some embodiments, while performing process sequence 610, exposed first surface 711 is exposed to reactive species from the impurity removal gas mixture. In some embodiments, first surface 711 extends around the entire exposed outer surface of metal line 710. In some embodiments, the reactive species for performing the impurity removal process are selected to have high selectivity among these materials, so that the reactive species can selectively remove the residuals. In one embodiment, a hydrogen containing gas supplied from a remote plasma source is provided to selectively remove the residuals. Nitrogen containing gas, such as $N_2$, $N_2O$, $NO_2$, ammonia ($NH_3$), may also be optionally supplied in the residual removal gas mixture. In some embodiments, the impurity removal gas mixture includes $H_2$ and $N_2$.

In some embodiments, while performing process sequence 610, several process parameters may also be regulated. In one exemplary embodiment, a process pressure in the processing chamber 300 is regulated between about 10 mTorr and about 500 mTorr, such as between about 100 mTorr and about 300 mTorr. A remote plasma source and/or an optional RF bias power may be utilized for the residual removal process. The power supplied to the remote plasma source may be between 200 Watts and about 30,000 Watts, such as about 5000 Watts. In one example, the RF bias power is not applied while supplying the residual removal gas mixture. The elimination of the RF bias power while performing the residual removal process can assist the reactive species in the plasma generated from the residual removal gas mixture to be more uniformly distributed across the first surface 711 with relatively gentle power without specific directionality.

In some embodiments, a hydrogen containing gas from the impurity removal gas mixture may be flowed into the chamber at a rate by volume between about 500 sccm to about 2000 sccm and the nitrogen containing gas may be supplied at a rate by volume between about 500 sccm to about 2000 sccm. The hydrocarbon containing gas and the nitrogen containing gas from the impurity removal gas mixture may be supplied simultaneously to the processing chamber or alternatively or sequentially supplied as needed.

In some embodiments, a substrate temperature including metal line 710 is maintained at greater than 100 degrees Celsius, such as between about 20 degrees Celsius to about 600 degrees Celsius, such as between about 150 degrees Celsius and about 350 degrees Celsius, for example between about 200 degrees Celsius and about 300 degrees Celsius. In some embodiments, the high temperature control of the substrate during the impurity removal process may assist and evaporate polymer materials from layers such as sacrificial layers, to enhance the removal efficiency without damaging other materials on the substrate.

Still referring to FIG. 6, method 600 may include at process sequence 612 performing an anneal process to remove impurities and grow the grain size of the metal line 710 under conditions sufficient to reduce the line edge roughness of the metal line 710 and first surface 711. For example, process sequence 612 includes annealing the metal line 710 at a pressure at or between 760 Torr and 76,000 Torr. In some embodiments, the annealing process at process sequence 606 is a high-pressure annealing process performed at high process pressure, such as greater than 1500 Torr but less than 52,504 Torr. The high-pressure annealing process may assist removing residuals and increasing the grain size of the metal line 710 and making the average line edge roughness (LER) of first surface 711 below 3 nanometers, below 2 nanometers, or below 1 nanometer. In some embodiments, the high process pressure may go up to 76,000 Torr. The high-pressure annealing process may be performed at a processing chamber, such as the processing chamber 200 depicted in FIG. 2, or other suitable processing chambers, including those that process substrate one at a time.

In some embodiments, a high-pressure annealing process performed at process sequence 612 maintains processing pressure at the high-pressure region in a vapor phase, for example in a dry vapor phase that has substantially no liquid droplets present. The processing pressure and temperature is controlled to density the film structures, to drive out impurities, increasing grain size, and smoothing out the surfaces of the metal line 710 such as first surface 711. In one embodiment, the high-pressure region or internal volume or internal volume 215 (as shown in FIG. 2) is pressurized to a pressure greater than atmosphere, for example greater than about 1500 Torr. In another example, the high-pressure region or internal volume 215 is pressurized to a pressure from about 760 Torr to about 76,000 Torr, such as from about 3750 to about 37,500 Torr, such as between about 18,750 Torr and about 42,000 Torr. As the high pressure may efficiently assist densifying the film structure, a relatively low processing temperature, such as less than 600 degrees Celsius, to reduce likelihood of thermal cycle damage to the substrate or film stack 701.

In some embodiments, during processing, the high-pressure region or internal volume 215 is maintained at a relatively low temperature, for example, a temperature less than 600 degrees Celsius, such as between about 300 degrees Celsius and about 600 degrees Celsius, by the heaters disposed within the outer chamber. Thus, a low thermal budget to the substrate may be obtained by utilizing the high-pressure annealing process along with low temperature regime.

In some embodiments, at process sequence 612, a hydrogen or nitrogen containing gas, such as $H_2$, $H_2O$, $H_2O_2$, $N_2O$, $NO_2$, $NH_3$, and dry steam, may be supplied during the annealing process. An inert gas, such as He and Ar, may also be supplied during the annealing process.

In some embodiments, a process pressure is regulated at a pressure greater than 760 Torr, such as between 760 Torr and 76,000 Torr. The process temperature may be controlled and rapidly ramped-up to 300 degrees Celsius but less than 600 degrees Celsius.

After the annealing process at high pressure, the metal line 710 has an improved film structure with high purity, large grain structure, and low line edge roughness below 3 nanometers, below 2 nanometers, or below 1 nanometer, which provides a relatively robust film structure that provides higher film density and low film resistivity. In some embodiments, metal line 710 is ruthenium (Ru) or Ru containing material, the film resistivity for the Ru containing material may be reduced between about 3% and about 7% after the high-pressure annealing process.

In some embodiments the grain size is measured in the line direction. In some embodiments, the grain size is greater than 100 nanometers, or greater than 200 nanometers, or between 100 and 250 nanometers when measured in the line direction.

In some embodiments, the line edge roughness of the metal line is improved or substantially improved by smoothing the surface of the metal line such as first surface 711 shown in FIG. 7B. In some embodiments, line edge roughness may be quantified by measuring the width of the metal line at a series of locations and averaging the variation over an interval, which is at least four times as long as the metal line is long. In some embodiments, scanning electron microscope may be used to evaluate line edge roughness. In some embodiments, a suitable methodology for measuring line edge roughness (LER) includes using scanning electron microscopy (SEM) with LER and critical dimension (CD) variation software for the metal line formed in accordance with the present disclosure. In some embodiments, line edge roughness information may be obtained by methods disclosed in International Publication No. WO 2005/059531 entitled Advanced Roughness Metrology and assigned to Applied Materials, Inc.

In some embodiments, the methods of the present disclosure reduce line edge roughness by reducing or eliminating a non-smooth outer surface of a metal line formed by subtractive etch methodology. Instead a smooth outer surface of the metal line is formed reducing or eliminating the scattering phenomena resulting in a lowering of resistivity. In some embodiments, line edge roughness of the first surface 711 of the metal line is reduced by five times or more. In some embodiments, line edge roughness of the first surface 711 of the metal line is reduced by 10% to 80%, or 20% to 70%, or about 50% when compared to a metal line formed using convention subtractive etching without the processes of the present disclosure. In some embodiments, line edge roughness of the first surface 711 of the metal line is reduced by about 5 nanometers to below 1 nanometer.

In some embodiments, the methods of the present disclosure reduce line width roughness (LWR) of a metal line formed by subtractive etch methodology. In embodiments, software tools including top-down SEM images are suitable for obtaining LWR information. In some embodiments, line width roughness of the metal line is reduced by 10% to 80%, or 20% to 70%, or about 50% when compared to a metal line formed using convention subtractive etching without the processes of the present disclosure. In some embodiments, line width roughness of the first surface 711 of the metal line is reduced by about 10 nanometers to below 1 nanometer.

Figure 8:
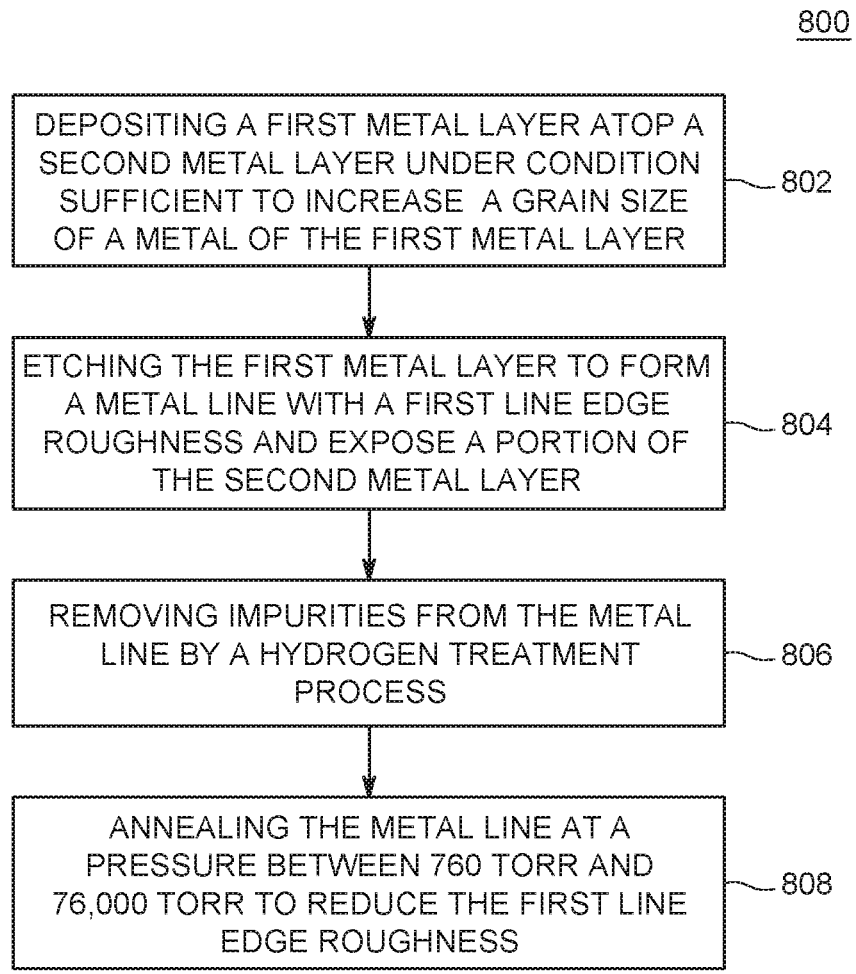
FIG. 8 depicts a flow diagram of a method of lowering resistance of an interconnection structure in accordance with an embodiment of the present disclosure.

Referring now to FIG. 8, the present disclosure relates to a method 800 of lowering resistivity of a metal line. At process sequence 802, method 800 includes depositing a first metal layer atop a second metal layer under conditions sufficient to increase a grain size of a metal of the first metal layer. In embodiments, conditions sufficient to increase a grain size of a metal of the first metal layer include depositing a first metal layer atop a second metal layer at a temperature between 20 degrees Celsius and 600 degrees Celsius and a pressure between 50 mTorr and 500 mTorr. In some embodiments, depositing the first metal layer atop a second metal layer is performed by a PVD process at a temperature between 20 degrees Celsius and 600 degrees Celsius and a pressure between 50 mTorr and 500 mTorr.

At process sequence 804, method 800 includes etching a first metal layer to form a metal line with a first line edge roughness and to expose a portion of a second metal layer. In embodiments, the etch is selective to the first metal layer material over the second metal layer material. In embodiments, etching is performed under conditions described above. At process sequence 806, method 800 includes removing impurities from the metal line by a hydrogen treatment process. In embodiments, removing impurities is performed until the first metal layer is at least 99.9% pure. In embodiments, removing impurities is performed until the first metal layer includes less than 0.1% impurities. At process sequent 808, method 800 includes annealing the metal line at a pressure between 760 Torr and 76,000 Torr to reduce the first line edge roughness. In embodiments, anneal is performed under conditions described above. In some embodiments, the first line edge roughness is reduced by at least 10%. In some embodiments, the first line edge roughness is reduced below 3 nanometers, below 2 nanometers, or below 1 nanometer.

In some embodiments, a method for patterning a conductor layer on a substrate, include: depositing a first metal layer atop a second metal layer; removing impurities from the first metal layer by a first hydrogen treatment process; annealing the first metal layer at a pressure of 760 Torr and 76,000 Torr; etching the first metal layer to form a metal line with a first line edge roughness atop the second metal layer and expose a top surface of the second metal layer; removing impurities from the metal line by a second hydrogen treatment process; and annealing the metal line under conditions sufficient to reduce the first line edge roughness. In some embodiments, the first metal layer includes ruthenium, molybdenum, iridium, platinum, or rhodium. In some embodiments, the first metal layer includes a different metal than the second metal layer. In some embodiments, depositing the first metal layer is a physical vapor deposition (PVD) process. In some embodiments, depositing the first metal layer is a chemical vapor deposition (CVD) process. In some embodiments, removing impurities from the first metal layer is performed at a pressure of 100 mTorr to 300 Torr. In some embodiments, removing impurities from the first metal layer is performed at a temperature of 20 degrees Celsius to 600 degrees Celsius. In some embodiments, the first hydrogen treatment process comprises contacting the first metal layer with a hydrogen containing gas comprising one or more of hydrogen ($H_2$), water ($H_2O$), hydrogen peroxide ($H_2O_2$), or ammonia ($NH_3$). In some embodiments, annealing the first metal layer is performed at a temperature of 300 degrees Celsius to 600 degrees Celsius. In some embodiments, removing impurities from the metal line is performed at a pressure of 100 mTorr to 300 Torr. In some embodiments, removing impurities from the metal line is performed at a temperature of 20 degrees Celsius to 600 degrees Celsius. In some embodiments, the second hydrogen treatment process includes contacting the metal line with a hydrogen containing gas comprising one or more of hydrogen ($H_2$), water ($H_2O$), hydrogen peroxide ($H_2O_2$), or ammonia ($NH_3$). In some embodiments, annealing the metal line is performed at a temperature of 300 degrees Celsius to 600 degrees Celsius.

In some embodiments, the present disclosure relates to a substrate processing system, including: a physical vapor depositing chamber configured for depositing a first metal layer on a substrate and for increasing a grain size of a metal of the first metal layer; and a thermal processing chamber configured for treating and annealing the first metal layer to remove impurities and increase the grain size of the metal. In some embodiments, the substrate processing system includes: a vacuum substrate transfer chamber, wherein the physical vapor depositing chamber is coupled to the vacuum substrate transfer chamber, wherein the thermal processing chamber is coupled to the vacuum substrate transfer chamber, and wherein the substrate processing system is configured to move a substrate from the physical vapor depositing chamber to the thermal processing chamber under vacuum. In some embodiments, the substrate processing system includes an etch chamber configured to etch the first metal layer to form a metal line. In some embodiments, the thermal processing chamber includes a processing chamber configured for high-pressure annealing.

In some embodiments, the present disclosure relates to a non-transitory computer readable medium having instructions stored thereon that, when executed, cause a method of lowering resistivity of a metal line, including: depositing a first metal layer atop a second metal layer under conditions sufficient to increase a grain size of a metal of the first metal layer; etching the first metal layer to form a metal line with a first line edge roughness and to expose a portion of the second metal layer; removing impurities from the metal line by a hydrogen treatment process; and annealing the metal line at a pressure between 760 Torr and 76,000 Torr to reduce the first line edge roughness.

While the foregoing is directed to embodiments of the present disclosure, other and further embodiments of the disclosure may be devised without departing from the basic scope thereof.

The invention claimed is:

1. A method of lowering resistivity of a metal line, comprising:
   depositing a first metal layer atop a second metal layer under conditions sufficient to increase a grain size of a metal of the first metal layer;
   selectively etching the first metal layer using a multiple step etch process to form a metal line with a first line edge roughness and to expose a portion of the second metal layer without attacking the second metal layer;

applying at least one of RF source power or RF bias power while supplying a main gas mixture during a main etch process of the multiple step etch process;

removing impurities to levels below 1% to below 0.1% from the metal line by a hydrogen treatment process; and annealing the metal line at a pressure between 760 Torr and 76,000 Torr to reduce the first line edge roughness.

2. The method of claim 1, wherein depositing the first metal layer atop a second metal layer is performed by a PVD process at a temperature between 20 degrees Celsius and 600 degrees Celsius and a pressure between 50 mTorr and 500 mTorr.

3. The method of claim 1, wherein the first line edge roughness is reduced by at least 10%.

4. A method for patterning a conductor layer on a substrate, comprising:

depositing a first metal layer atop a second metal layer;

removing impurities to levels below 1% to below 0.1% from the first metal layer by a first hydrogen treatment process;

annealing the first metal layer at a pressure of 760 Torr and 76,000 Torr;

selectively etching the first metal layer using a multiple step etch process to form a metal line with a first line edge roughness atop the second metal layer and expose a top surface of the second metal layer without attacking the second metal layer;

applying at least one of RF source power or RF bias power while supplying a main gas mixture during a main etch process of the multiple step etch process;

removing impurities from the metal line by a second hydrogen treatment process; and annealing the metal line under conditions sufficient to reduce the first line edge roughness.

5. The method of claim 4, wherein the first metal layer comprises ruthenium, molybdenum, iridium, platinum, or rhodium.

6. The method of claim 4, wherein the first metal layer comprises a different metal than the second metal layer.

7. The method of claim 4, wherein depositing the first metal layer is a physical vapor deposition (PVD) process.

8. The method of claim 4, wherein depositing the first metal layer is a chemical vapor deposition (CVD) process.

9. The method of claim 4, wherein removing impurities from the first metal layer is performed at a pressure of 100 mTorr to 300 Torr.

10. The method of claim 4, wherein removing impurities from the first metal layer is performed at a temperature of 20 degrees Celsius to 600 degrees Celsius.

11. The method of claim 4, wherein the first hydrogen treatment process comprises contacting the first metal layer with a hydrogen containing gas comprising one or more of hydrogen ($H_2$), water ($H_2O$), hydrogen peroxide ($H_2O_2$), or ammonia ($NH_3$).

12. The method of claim 4, wherein annealing the first metal layer is performed at a temperature of 300 degrees Celsius to 600 degrees Celsius.

13. The method of claim 4, wherein removing impurities from the metal line is performed at a pressure of 100 mTorr to 300 Torr.

14. The method of claim 4, wherein removing impurities from the metal line is performed at a temperature of 20 degrees Celsius to 600 degrees Celsius.

15. The method of claim 4, wherein the second hydrogen treatment process comprises contacting the metal line with a hydrogen containing gas comprising one or more of hydrogen ($H_2$), water ($H_2O$), hydrogen peroxide ($H_2O_2$), or ammonia ($NH_3$).

16. The method of claim 4, wherein annealing the metal line is performed at a temperature of 300 degrees Celsius to 600 degrees Celsius.

17. The method of claim 1, wherein removing impurities from the metal line by the hydrogen treatment process comprises removing impurities to levels below 0.1% by total weight of the metal line.

18. The method of claim 1, wherein the multiple step etch process comprises a three step process including a breakthrough process, a bulk etching process, and a residual clean process.

19. The method of claim 1, wherein metal line has an aspect ratio of one of 20 to 1, 15 to 1, 10 to 1, 5 to 1, or 0.5 to 1.

20. The method of claim 1, wherein the first line edge roughness is one of reduced below 3 nanometers, below 2 nanometers, or below 1 nanometers.

* * * * *